(12) United States Patent
Inada et al.

(10) Patent No.: US 9,595,648 B2
(45) Date of Patent: Mar. 14, 2017

(54) LIGHT-EMITTING DEVICE

(71) Applicant: PANASONIC INTELLECTUAL PROPERTY MANAGEMENT CO., LTD., Osaka (JP)

(72) Inventors: Yasuhisa Inada, Osaka (JP); Kazuyuki Yamae, Nara (JP); Akira Hashiya, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/783,239

(22) PCT Filed: Jan. 17, 2014

(86) PCT No.: PCT/JP2014/000220
§ 371 (c)(1),
(2) Date: Oct. 8, 2015

(87) PCT Pub. No.: WO2014/167758
PCT Pub. Date: Oct. 16, 2014

(65) Prior Publication Data
US 2016/0049562 A1    Feb. 18, 2016

(30) Foreign Application Priority Data

Apr. 12, 2013    (JP) .................................. 2013-084132

(51) Int. Cl.
*H01L 33/58* (2010.01)
*H01L 33/22* (2010.01)
(Continued)

(52) U.S. Cl.
CPC ............ *H01L 33/58* (2013.01); *G02B 5/0221* (2013.01); *H01L 33/22* (2013.01);
(Continued)

(58) Field of Classification Search
CPC ......... H01L 33/00; H01L 33/14; H01L 51/00; H01L 33/12; H01L 33/40; H01L 33/50;
(Continued)

(56) References Cited

U.S. PATENT DOCUMENTS 9,184,404 B2    11/2015   Kuzuoka et al.
2002/0180348 A1    12/2002   Oda et al.
(Continued)

FOREIGN PATENT DOCUMENTS

EP    2555587 A1    2/2013
JP    04-328295    11/1992
(Continued)

OTHER PUBLICATIONS

U.S. Appl. No. 14/772,599 to Kazuyuki Yamae et al., which was filed Sep. 3, 2015.
(Continued)

*Primary Examiner* — Chuong A Luu
(74) *Attorney, Agent, or Firm* — Greenblum & Bernstein, P.L.C.

(57) ABSTRACT

An illuminator includes a light-emitting element and a light extraction sheet which transmits light occurring from the light-emitting element. The light-emitting element includes a first electrode having a light transmitting property, a second electrode, and an emission layer between the first and second electrodes. The light extraction sheet includes a light-transmitting substrate having a first principal face and a second principal face, a first light extraction structure on the first principal face side of the light-transmitting substrate, and a second light extraction structure on the second principal face side of the light-transmitting substrate. The first light extraction structure includes a low-refractive index layer and a high-refractive index layer. The second light extraction structure is arranged so that light which is trans-
(Continued)

mitted through the light-transmitting substrate and arrives at an incident angle of 40 degrees to 60 degrees has an average transmittance of 42% or more.

20 Claims, 29 Drawing Sheets

(51) Int. Cl.
  *H01L 51/52* (2006.01)
  *G02B 5/02* (2006.01)
(52) U.S. Cl.
  CPC .. *H01L 51/5275* (2013.01); *H01L 2251/5315* (2013.01); *H01L 2251/5369* (2013.01)
(58) Field of Classification Search
  CPC ......... H01L 33/36; H01L 33/44; H01L 33/48; H01L 33/46; H01L 33/52; H01L 33/58; H01L 33/60; H01L 33/62; H01L 33/64; H01L 51/50; H01L 51/52
  USPC .... 257/98, 80, 82, 83, 88, 95, 99, 100, 431, 257/432
  See application file for complete search history.

(56) References Cited

U.S. PATENT DOCUMENTS

| | | |
|---|---|---|
| 2004/0189185 A1 | 9/2004 | Yotsuya |
| 2006/0192483 A1 | 8/2006 | Nakanishi et al. |
| 2008/0197764 A1 | 8/2008 | Bechtel et al. |
| 2010/0110551 A1 | 5/2010 | Lamansky et al. |
| 2011/0080737 A1 | 4/2011 | Nishiwaki et al. |
| 2012/0248970 A1* | 10/2012 | Okuyama ........... H01L 51/5268 313/504 |
| 2012/0286258 A1 | 11/2012 | Naraoka et al. |
| 2012/0292652 A1 | 11/2012 | Yamae et al. |
| 2013/0015486 A1 | 1/2013 | Sekine et al. |
| 2016/0141554 A1* | 5/2016 | Hashiya .............. H01L 51/5275 257/98 |

FOREIGN PATENT DOCUMENTS

| | | |
|---|---|---|
| JP | 2991183 | 10/1999 |
| JP | 2003-100444 | 4/2003 |
| JP | 2004-241130 | 8/2004 |
| JP | 2006-190573 | 7/2006 |
| JP | 2008-541368 | 11/2008 |
| JP | 2009-272059 | 11/2009 |
| JP | 2012-227122 | 11/2012 |
| WO | 2010/051229 A2 | 5/2010 |
| WO | 2012/108384 A1 | 8/2012 |

OTHER PUBLICATIONS

PCT Search Report issued by the Japanese Patent Office in PCT/JP2014/000220, dated Apr. 22, 2014.

Search Report issued in European Patent Office (EPO) Patent Application No. 14783361.0, dated Apr. 7, 2016.

* cited by examiner

MICROLENS ARRAY

LIGHT DIFFUSING LAYER

ASPECT RATIO = h/r (a) RANDOM 1  w = 0.6 μm
(b) RANDOM 2  w = 1.2 μm

SNELL'S LAW   $n_1 \sin \theta_1 = n_2 \sin \theta_2$ (a) AVERAGE PERIOD 3W    (b) AVERAGE PERIOD 3.3W    (c) AVERAGE PERIOD 3.4W

LIGHT-EMITTING DEVICE

TECHNICAL FIELD

The present application relates to an illuminator.

BACKGROUND ART

As organic electro-luminescence devices (hereinafter referred to as "organic EL devices"), those are known in which a hole transport layer, an organic emission layer, an electron transport layer, and a cathode are stacked in this order on a transparent electrode (anode) that is formed on the surface of a transparent substrate. By applying a voltage between the anode and the cathode, light occurs from the organic emission layer. The generated light is transmitted through the transparent electrode and the transparent substrate to be extracted to the exterior.

Organic EL devices are characterized by being self-light-emitting type devices, having emission characteristics with a relatively high efficiency, being capable of emission in various color tones, and so on. Therefore, their application to light-emitting elements in display devices (e.g., flat panel displays) and light sources (e.g., backlights or illuminations for liquid crystal display devices) is considered as promising, and some of that has already matured into practical use. In order to apply organic EL devices to such uses, it is desirable to develop organic EL devices that have good characteristics marked by higher efficiency, longer life, and higher luminance.

There are mainly three factors that govern the efficiency of an organic EL device: efficiency of electrical-optical conversion, driving voltage, and light extraction efficiency.

As for efficiency of electrical-optical conversion, those with an external quantum efficiency over 20% have been reported due to the rise of so-called phosphor materials in recent years. As converted into an internal quantum efficiency, this value would be equivalent to substantially 100%. In other words, there have already been experimental instances where the substantial limit value of efficiency of electrical-optical conversion is reached.

As for driving voltage, devices are becoming available which achieve emission with relatively high luminance at a voltage that is about 10% to 20% greater than the voltage corresponding to an energy gap. In other words, in organic EL devices, there is not much room for efficiency improvement based on reduced driving voltage.

Thus, efficiency improvements in organic EL devices based on improving on the two factors of efficiency of electrical-optical conversion and driving voltage are not highly expectable.

On the other hand, the light extraction efficiency of an organic EL device, which is generally on the order of 20% to 30% although subject to some fluctuation depending on the emission pattern and internal layer structure, leaves room for improvement. The reason for such low light extraction efficiency is that the material(s) composing the sites of light emission and their neighborhood has characteristics such as a high refractive index and light absorption. This causes a problem in that total reflection may occur at interfaces between different refractive indices and light may be absorbed by the material(s), thus hindering effective light propagation to the exterior where emission is to be observed. Consequently, in an organic EL device, non-available light accounts for 70% to 80% of the total emission amount. Thus, there is a very large expectation of improvements in the efficiency of an organic EL device that are based on light extraction efficiency improvements.

Against this background, many attempts at improving the light extraction efficiency have been made up to the present. For example, Patent Document 1 discloses an organic EL device having a diffraction grating for suppressing total reflection at interfaces. Patent Document 2 discloses an organic EL device in which a microlens array is provided on the surface of a transparent substrate. Patent Document 3 discloses an organic EL device having an optical sheet with an optical layer that includes beads dispersed in a binder.

CITATION LIST

Patent Literature

[Patent Document 1] the specification of Japanese Patent No. 2991183

[Patent Document 2] Japanese Laid-Open Patent Publication No. 2004-241130

[Patent Document 3] Japanese Laid-Open Patent Publication No. 2003-100444

SUMMARY OF INVENTION

Technical Problem

However, the aforementioned conventional techniques only provide limited effects of improving the efficiency of light extraction, and further efficiency improvements are desired. In addition to the aforementioned organic EL devices, this problem similarly applies to other kinds of illuminators in which inorganic EL devices or usual light-emitting diodes or the like are used.

One non-limiting, and exemplary embodiment of the present application provides an illuminator with an enhanced efficiency of light extraction.

Solution to Problem

In order to solve the above problems, a light extraction sheet according to an implementation of the present invention comprises: a light-transmitting substrate having a first principal face and a second principal face; a first light extraction structure on the first principal face side of the light-transmitting substrate, the first light extraction structure including a low-refractive index layer having a lower refractive index than does the light-transmitting substrate and a high-refractive index layer having a higher refractive index than does the low-refractive index layer, the low-refractive index layer being between the light-transmitting substrate and the high-refractive index layer, and an interface between the high-refractive index layer and the low-refractive index layer having bump-dent features; and a second light extraction structure on the second principal face side of the light-transmitting substrate, the second light extraction structure being arranged so that light which is transmitted through the light-transmitting substrate and arrives at an incident angle of 40 degrees to 60 degrees has an average transmittance of 42% or more.

The aforementioned general/specific implementation can be implemented by using a system, a method, or a computer program, or can be realized by using a combination of a system, a method, and a computer program.

Advantageous Effects of Invention

An illuminator according to an implementation of the present invention provides an enhanced efficiency of light extraction.

DESCRIPTION OF EMBODIMENTS

Figure 1:
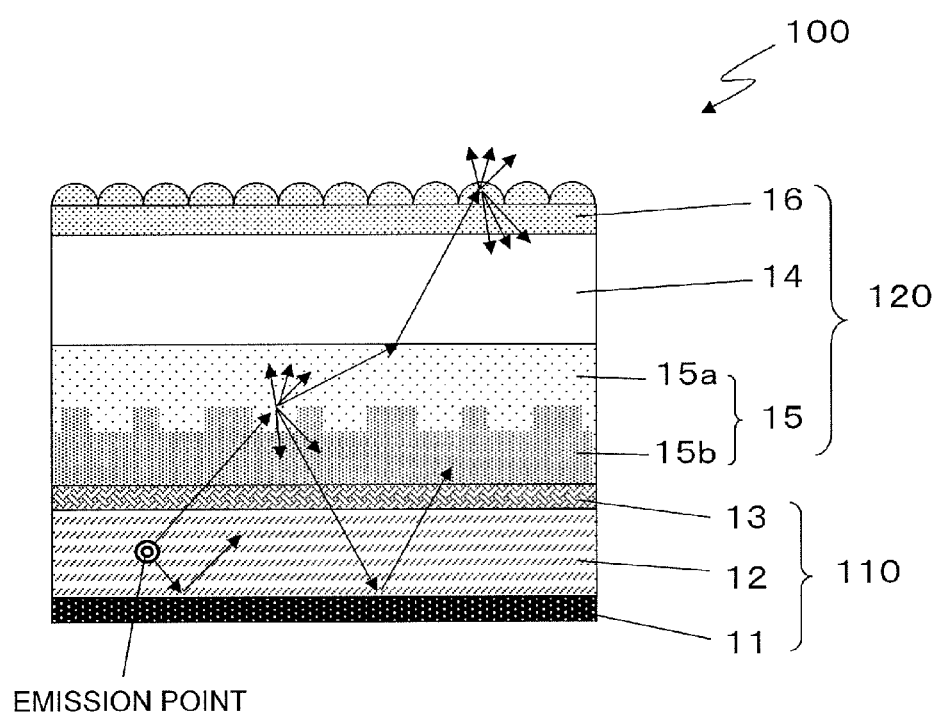
FIG. 1 A cross-sectional view showing an organic EL device according to an illustrative embodiment.

Prior to describing specific embodiments, a finding that served as a basis of the present invention will be described first.

In conventional generic organic EL devices, in which the organic emission layer has a refractive index of 1.7 to 2.0 and the transparent substrate has a refractive index of about 1.5, total reflection occurs at the interface between the organic emission layer and the transparent substrate. The loss of light due to such total reflection may be as large as about 50% or more of the entire radiated light, according to an analysis by the inventors. Furthermore, since the transparent substrate has a refractive index of about 1.5 and air has a refractive index of about 1.0, the loss of light caused by total reflection at the interface between the transparent substrate and air accounts for about 50% of the light reaching the interface of the transparent substrate. Thus, there are very large total reflection losses at these two interfaces.

The inventors have found a novel construction which can reduce the total reflection losses at these two interfaces. Specifically, we have found that the light extraction efficiency can be improved in a construction where: a first light extraction structure to cause light diffraction is provided between an emission layer and a transparent substrate; and a second light extraction structure such as a microlens array is provided on the opposite side of the transparent substrate from the emission layer. Hereinafter, embodiments based on this finding will be described.

In outline, embodiments of the present invention are as follows.

(1) An illuminator as one implementation of the present invention comprises: a light-emitting element for emitting light of an average wavelength $\lambda$; and a light extraction sheet which transmits light occurring from the light-emitting element. The light-emitting element includes a first electrode having a light transmitting property, a second electrode, and an emission layer between the first and second electrodes. The light extraction sheet includes: a light-transmitting substrate having a first principal face and a second principal face; a first light extraction structure on the first principal face side of the light-transmitting substrate, the first light extraction structure including a low-refractive index layer having a lower refractive index than does the light-transmitting substrate and a high-refractive index layer having a higher refractive index than does the low-refractive index layer, the low-refractive index layer being between the light-transmitting substrate and the high-refractive index layer, and an interface between the high-refractive index layer and the low-refractive index layer having bump-dent features; and a second light extraction structure on the second principal face side of the light-transmitting substrate, the second light extraction structure being arranged so that light which is transmitted through the light-transmitting substrate and arrives at an incident angle of 40 degrees to 60 degrees has an average transmittance of 42% or more.

(2) In one embodiment, the bump-dent features comprise a random two-dimensional array of a plurality of dents and a plurality of bumps.

(3) In one embodiment, the bump-dent structure comprises a periodic two-dimensional array of a plurality of dents and a plurality of bumps.

(4) In one embodiment, the bump-dent features comprise a two-dimensional array of a plurality of dents and a plurality of bumps, and among spatial frequency components of a pattern of the bump-dent features, those components which are smaller than $1/(2w)$ are suppressed as compared to when the plurality of dents and the plurality of bumps are randomly arrayed, where w is a minimum value of lengths of shorter sides of ellipses which are inscribed in the plurality of dents and the plurality of bumps.

(5) In one embodiment, the bump-dent features are arranged so that no predetermined number or more of dents or bumps are successively present along one direction.

(6) In one embodiment, the plurality of dents and the plurality of bumps each have a rectangular cross section, and the bump-dent features are arranged so that no three or more dents or bumps are successively present along one direction.

(7) In one embodiment, the plurality of dents and the plurality of bumps each have a hexagonal cross section, and the bump-dent features are arranged so that no four or more dents or bumps are successively present along one direction.

(8) In one embodiment, a minimum value of lengths of shorter sides of ellipses which are inscribed in the plurality of dents and the plurality of bumps is $0.73\lambda$ or more.

(9) In one embodiment, the plurality of dents and the plurality of bumps have a same cross-sectional shape and a same size.

(10) In one embodiment, the plurality of dents and the plurality of bumps each have an average period of $14.5\lambda$ or less.

(11) In one embodiment, the low-refractive index layer has a refractive index which is 0.98 times or less of a refractive index of the light-transmitting substrate.

(12) In one embodiment, a distance between an emission point in the emission layer and the surface of the second electrode is $0.17\lambda$ or more.

(13) In one embodiment, the low-refractive index layer has a refractive index of 1.47 or less.

(14) In one embodiment, the low-refractive index layer has a thickness of $(\frac{1}{2})\lambda$ or more.

(15) In one embodiment, the light-transmitting substrate has a refractive index of 1.5 or more.

(16) In one embodiment, the high-refractive index layer has a refractive index of 1.73 or more.

(17) In one embodiment, the second light extraction structure comprises a microlens array.

(18) In one embodiment, the microlens array has an aspect ratio of 0.5 or more.

(19) In one embodiment, the second light extraction structure comprises pyramidal structures, vertex angles of the pyramidal structures being in a range from 30 degrees to 120 degrees.

(20) A light extraction sheet as another implementation of the present invention comprises: a light-transmitting substrate having a first principal face and a second principal face; a first light extraction structure on the first principal face side of the light-transmitting substrate, the first light extraction structure including a low-refractive index layer having a lower refractive index than does the light-transmitting substrate and a high-refractive index layer having a higher refractive index than does the low-refractive index layer, the low-refractive index layer being between the light-transmitting substrate and the high-refractive index layer, and an interface between the high-refractive index layer and the low-refractive index layer having bump-dent features; and a second light extraction structure on the second principal face side of the light-transmitting substrate, the second light extraction structure being arranged so that light which is transmitted through the light-transmitting substrate and arrives at an incident angle of 40 degrees to 60 degrees has an average transmittance of 42% or more.

Embodiment

Hereinafter, a more specific embodiment will be described. In the present embodiment, an illuminator in which an organic EL device is utilized will be described as an example.

[1. Overall Construction]

FIG. 1 is a cross-sectional view showing a schematic construction of an organic EL device 100 according to the present embodiment. The organic EL device 100 of the present embodiment includes a light-emitting element 110 and a light extraction sheet 120 which transmits light occurring from the light-emitting element 110. The light-emitting element 110 includes a reflection electrode 11 having a light-reflecting property, a transparent electrode 13 having a light transmitting property, and an organic emission layer 12 formed between them. The light extraction sheet 120 includes a transparent substrate 14, an internal light-extraction layer 15 provided on the first principal face (i.e., the lower side in FIG. 1) of the transparent substrate 14, and an external light-extraction layer 16 provided on the second principal face (i.e., the upper side in FIG. 1) of the transparent substrate 14. As shown in FIG. 1, the reflection electrode 11, the organic emission layer 12, the transparent electrode 13, the internal light-extraction layer 15, the transparent substrate 14, and the external light-extraction layer 16 are stacked in this order. The internal light-extraction layer 15 includes a low-refractive index layer 15a having a relatively low refractive index and a high-refractive index layer 15b having a relatively high refractive index. The interface between the low-refractive index layer 15a and the high-refractive index layer 15b has bump-dent features so as to diffract incident light.

The reflection electrode 11 is an electrode (cathode) for injecting electrons into the emission layer 12. When a predetermined voltage is applied between the reflection electrode 11 and the transparent electrode 13, electrons are injected from the reflection electrode 11 into the emission layer 12. As the material of the reflection electrode 11, for example, silver (Ag), aluminum (Al), copper (Cu), magnesium (Mg), lithium (Li), sodium (Na), or an alloy containing these as main components, etc., can be used. Moreover, a combination of such metals may be stacked to form the reflection electrode 11; and a transparent electrically-conductive material such as indium tin oxide (ITO) or PEDOT:PSS (a mixture of polythiophene and polystyrene sulfonate) may be stacked in contact with such metals to form the reflection electrode 11.

The transparent electrode 13 is an electrode (anode) for injecting holes into the emission layer 12. The transparent electrode 13 may be composed of a material such as a metal, an alloy, or an electrically-conductive compound having a relatively large work function, a mixture thereof, etc. Examples of the material of the transparent electrode 13 include: inorganic compounds such as ITO, tin oxides, zinc oxides, IZO (registered trademark), and copper iodide; electrically conductive polymers such as PEDOT and polyaniline; electrically conductive polymers doped with an arbitrary acceptor or the like; electrically-conductive light transmitting-materials such as carbon nanotubes.

After forming the internal light-extraction layer 15 on the transparent substrate 14, the transparent electrode 13 can be formed as a thin film by a sputtering technique, a vapor deposition technique, an application technique, or the like. The sheet resistance of the transparent electrode 13 is set to e.g. several hundred $\Omega/\square$ or less, and in some instances may be set to $100\Omega/\square$ or less. The film thickness of the transparent electrode 13 is e.g. 500 nm or less, and in some instances may be set in a range of 10 to 200 nm. As the transparent electrode 13 becomes thinner, the light transmittance will improve, but the sheet resistance will increase because sheet resistance increases in inverse proportion to film thickness. When organic EL is to be achieved in a large area, this may lead to high voltage issues, and problems of nonuniform luminance due to nonuniform current density caused by a voltage drop. In order to avoid this trade off, auxiliary wiring (grid) of a metal or the like may be formed on the transparent electrode 13. As the material of the auxiliary wiring, those with good electrically conductive are used. For example, Ag, Cu, Au, Al, Rh, Ru, Ni, Mo, Cr, Pd, or an alloy thereof (MoAlMo, AlMo, AgPdCu, etc.) can be used. At this time, the grid portion may be subjected to an insulation treatment to prevent a current flow, so that the metal grid will not serve as a light-shielding material. In order to prevent diffused light from being absorbed by the grid, a metal with high reflectance may be used for the grid.

Although the present embodiment illustrates that the transparent electrode 13 is an anode and the reflection electrode 11 is a cathode, the polarities of these electrodes may be opposite. Materials similar to those mentioned above can be used for the transparent electrode 13 and the reflection electrode 11 even in the case where the transparent electrode 13 is the cathode and the reflection electrode 11 is the anode.

The emission layer 12 is made of a material which generates light through recombination of electrons and holes that are injected from the transparent electrode 13 and the reflection electrode 11. For example, the emission layer 12 can be made of a low-molecular-weight or high-molecular-weight light-emitting material, or any commonly-known light-emitting material such as metal complexes. Although not shown in FIG. 1, an electron transport layer and a hole transport layer may be provided on both sides of the emission layer 12. The electron transport layer is provided on the reflection electrode 11 (cathode) side, while the hole transport layer is provided on the transparent electrode 13 (anode) side. In the case where the reflection electrode 11 is the anode, the electron transport layer is to be provided on the transparent electrode 13 side, and the hole transport layer is to be provided on the electrode 11 side. The electron transport layer can be selected as appropriate from among compounds having an electron-transporting property. Examples of such compounds include: Alq3 or other metal complexes known as electron-transporting materials; compounds having heterocycles, such as phenanthroline derivatives, pyridine derivatives, tetrazine derivatives, and oxadiazole derivatives; and the like. However, without being limited to these materials, any commonly-known electron-transporting material can be used. The hole transport layer can be selected as appropriate from among compounds having a hole-transporting property. Examples of such compounds include 4,4'-bis[N-(naphthyl)-N-phenyl-amino]biphenyl(α-NPD); N,N'-bis(3-methylbiphenyl)-(1,1'-biphenyl)-4,4'-diamine (TPD); 2-TNATA; 4,4',4"-tris(N-(3-methylbiphenyl)N-phenylamino)triphenylamine (MTDATA); 4,4'-N,N'-dicarbazolebiphenyl(CBP); spiro-NPD; spiro-TPD; Spiro-TAD; or, triarylamine-type compounds such as TNB, amine compounds containing a carbazole group, amine compounds including fluorene derivatives, and so on. However, without being limited to these materials, any commonly-known hole-transporting material can be used. Thus, in addition to the emission layer 12, other layers such as an electron transport layer and a hole transport layer may be provided between the reflection electrode 11 and the transparent electrode 13. In the following description, the layer(s) between the reflection electrode 11 and the transparent electrode 13 may collectively be referred to as an "organic EL layer".

Without being limited to the above examples, various structures may be adopted as the structure of the organic EL layer. For example, a multilayer structure of a hole transport layer and the emission layer 12, or a multilayer structure of the emission layer 12 and an electron transport layer may be adopted. Moreover, a hole injection layer may be present between the anode and a hole transport layer, or an electron injection layer may be present between the cathode and an electron transport layer. Without being limited to a single layer structure, the emission layer 12 may have a multilayer structure. For example, when the desired emission color is white, the emission layer 12 may be doped with three dopant dyes of red, green, and blue. Moreover, a multilayer structure of a blue hole-transporting emission layer, a green electron-transporting emission layer, and a red electron-transporting emission layer may be adopted; or a multilayer structure of a blue electron-transporting emission layer, a green electron-transporting emission layer, and a red electron-transporting emission layer may be adopted. Furthermore, a structure in which a plurality of emission units are stacked via an intermediate layer having a light transmitting property and electrically conductivity (i.e., a multiunit structure in electrical series connection) may be adopted, where each emission unit is defined as layers including an element that emits light when interposed between an anode and a cathode and a voltage is applied thereto.

The transparent substrate 14 is a member for supporting the internal light-extraction layer 15, the transparent electrode 13, the emission layer 12, and the reflection electrode 11. As the material of the transparent substrate 14, for example, a transparent material such as glass or resin can be used. The transparent substrate 14 has a refractive index on the order of 1.45 to 1.65, for example; however, a high-refractive index substrate having a refractive index of 1.65 or more, or a low-refractive index substrate having a refractive index less than 1.45 may also be used.

The internal light-extraction layer 15 is a light-transmitting layer which is provided between the transparent substrate 14 and the transparent electrode 13. The internal light-extraction layer 15 includes the low-refractive index layer 15a formed on the transparent substrate 14 side and the high-refractive index layer 15b formed on the transparent electrode 13 side. Their interface constitutes a bump-dent structure. As will be described later, the low-refractive index layer 15a in the present embodiment is made of a light-transmitting material having a lower refractive index than that of the transparent substrate 14. On the other hand, the high-refractive index layer 15b is made of a light-transmitting material having a higher refractive index than that of the transparent substrate 14. The high-refractive index layer 15b may be made of a material having a higher refractive index than that of the transparent substrate 14, so long as its refractive index is lower than that of the low-refractive index layer 15a.

Figure 2A:
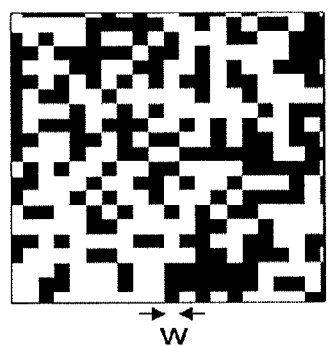
FIG. 2A A plan view showing an exemplary bump-dent structure.
Figure 2B:
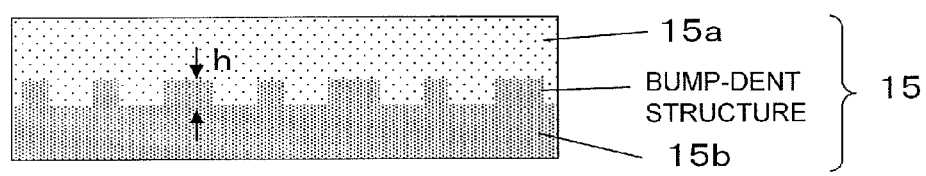
FIG. 2B A cross-sectional view showing an exemplary bump-dent structure.

FIG. 2A is a plan view schematically showing an exemplary bump-dent structure in the present embodiment. FIG. 2B is a cross-sectional view schematically showing a part of the bump-dent structure. In FIG. 2A, black regions and white regions respectively represent portions (bumps) where the high-refractive index layer 15b is formed relatively thick and portions (dents) where the high-refractive index layer 15b is formed relatively thin. This bump-dent structure is a random two-dimensional array of two kinds of square-shaped unit structures (with a level difference h) each having a side length (width) w. In the following description, each unit structure may be referred to as a "block". By providing such a bump-dent structure, it becomes possible to diffract incident light. As will be described later, instead of adopting a completely random pattern for the bump-dent structure, a structure may be adopted whose randomness is reduced so that no unit structures of the same kind successively appear a predetermined number of times or more along one direction. Moreover, a periodic pattern may be adopted as the pattern of the bump-dent structure. Furthermore, instead of forming a bump-dent structure, high-refractive index particles may be injected near the interface between the low-refractive index layer 15a and the high-refractive index layer 15b in order to cause light diffraction. The light extraction efficiencies when these respective constructions are adopted will be described later.

A portion of the light occurring from the emission layer 12 is incident on the internal light-extraction layer 15 via the transparent electrode 13. At this time, any light that strikes at an incident angle exceeding the critical angle, which would normally have undergone total reflection, receives a diffractive action by the internal light-extraction layer 15 so that a portion thereof is extracted through the transparent substrate 14. The light which has not been extracted by the internal light-extraction layer 15 is reflected so as to travel at a different angle toward the emission layer 12, but is thereafter reflected by the reflection electrode 11, thus again being incident on the internal light-extraction layer 15. On the other hand, a portion of the light occurring from the emission layer 12 is reflected by the electrode 11, and then is transmitted through the transparent electrode 13 so as to be incident on the internal light-extraction layer 15. Thus, providing the internal light-extraction layer 15 allows light to be extracted toward the exterior through repetitive multiple reflection.

The external light-extraction layer 16 is provided on the surface of the transparent substrate 14 (i.e., the face opposite to the face on which the internal light-extraction layer 15 is provided). The external light-extraction layer 16 may be composed of a microlens array, for example. As will be described later, the external light-extraction layer 16 is arranged so that light which is transmitted through the transparent substrate 14 and arrives at an incident angle of 40 degrees to 60 degrees has an average transmittance of 42% or more. The specific construction of the external light-extraction layer 16 will be described later. Providing the external light-extraction layer 16 allows a portion of the light which is transmitted through the transparent substrate 14 and arrives at an incident angle exceeding the critical angle to be extracted into the external layer of air. The unextracted light will again return to the emission layer 12, but will eventually be reflected by the reflection electrode 11, thus being able to be extracted back into the air layer. The air layer has a refractive index of 1.0, for example.

If absorption of light by materials occurs before the light is extracted, it will detract from efficiency; therefore, materials with a low light absorbing property may be used for the reflection electrode 11, the emission layer 12, the transparent electrode 13, and the internal light-extraction layer 15 in the present embodiment.

[2. Details and Analysis of Constituent Elements]

Hereinafter, details of the respective constituent elements of the organic EL device 100 and the analytic results that led to the construction of the present embodiment will be described.

[2-1. Analysis of External Light-Extraction Layer 16]

Light occurring from the emission layer 12 travels through the transparent electrode 13, the internal light-extraction layer 15, and the transparent substrate 14, thereafter reaching the external light-extraction layer 16. The external light-extraction layer 16 may be formed by directly processing the transparent substrate 14, or formed by attaching a film having a light extraction structure provided thereon.

Figure 3A:
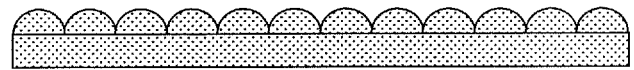
FIG. 3A A diagram schematically showing an exemplary microlens array.
Figure 3B:
FIG. 3B A diagram schematically showing an exemplary light diffusing layer.
Figure 4:
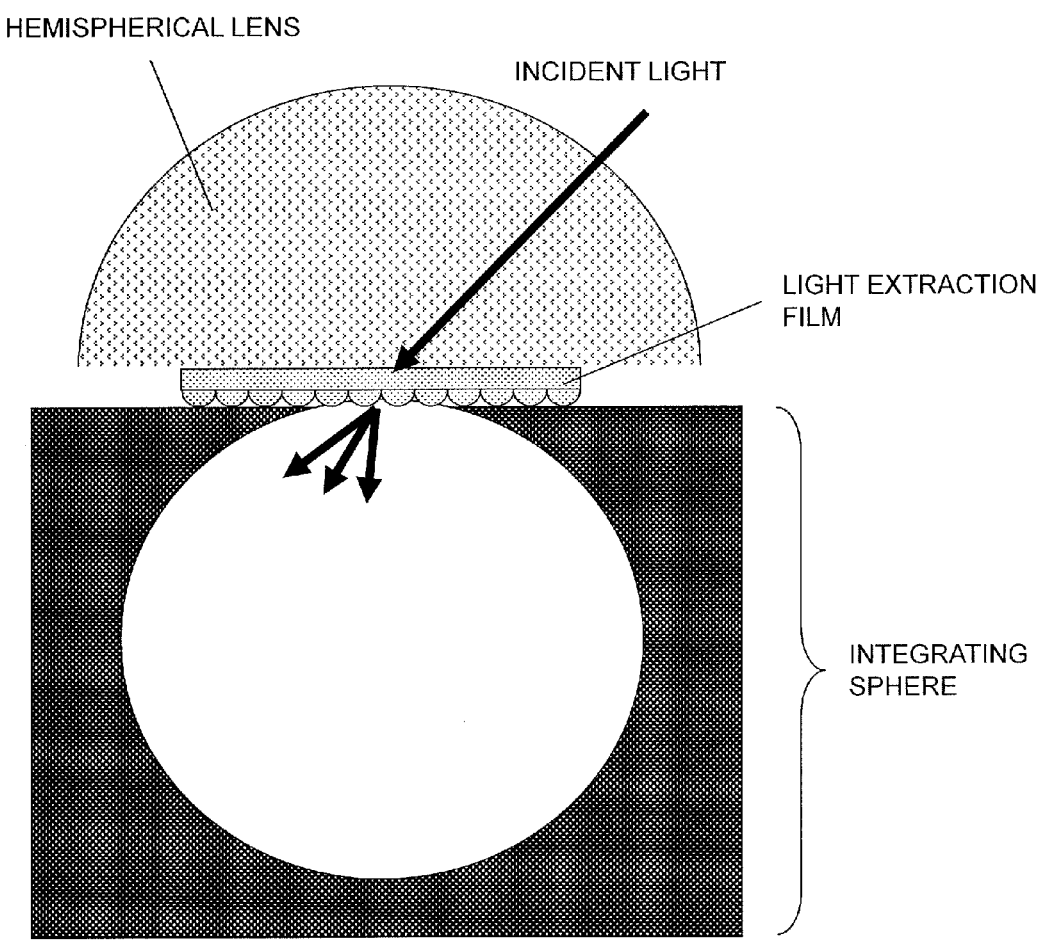
FIG. 4 A diagram showing a measurement method of light transmittance.

First, the inventors conducted a light extraction structure analysis by using a microlens array film shown in FIG. 3A and a diffusion-type film shown in FIG. 3B as examples of the external light-extraction layer 16. In order to study total reflection-suppressing effects of these light extraction structures, the light transmittance of each film was measured. The method of light transmittance measurement will be described with reference to FIG. 4.

First, on each film (or substrate), a hemispherical lens having about the same refractive index as that of the transparent substrate 14 was attached, and light which was incident from the hemispherical lens was detected with an integrating sphere having a minute hole, thereby measuring the transmittance of that film. At this time, the incident angle of the incident light was varied in order to measure angle dependence of transmittance. Also, with a similar construction to this experiment, ray tracing calculation was performed.

Figure 5A:
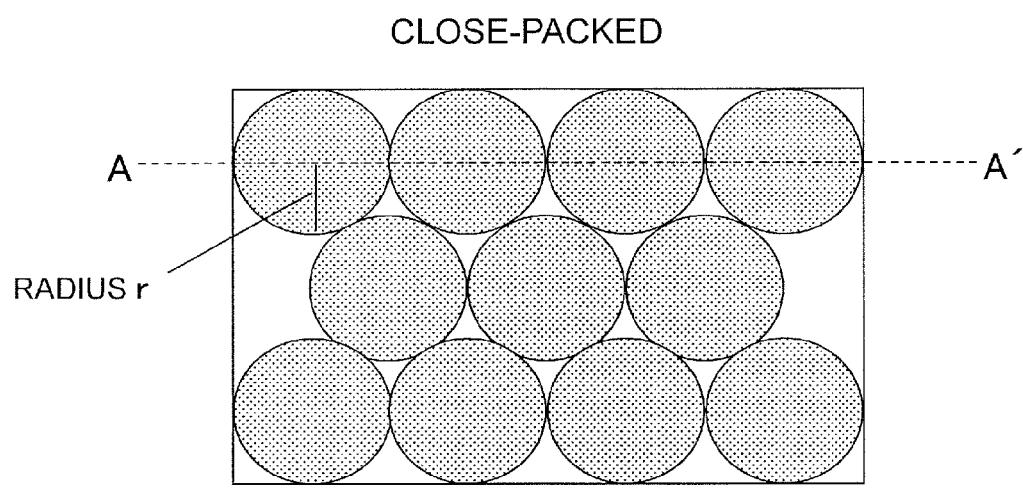
FIG. 5A A plan view showing an exemplary arrangement of a microlens array.
Figure 5B:
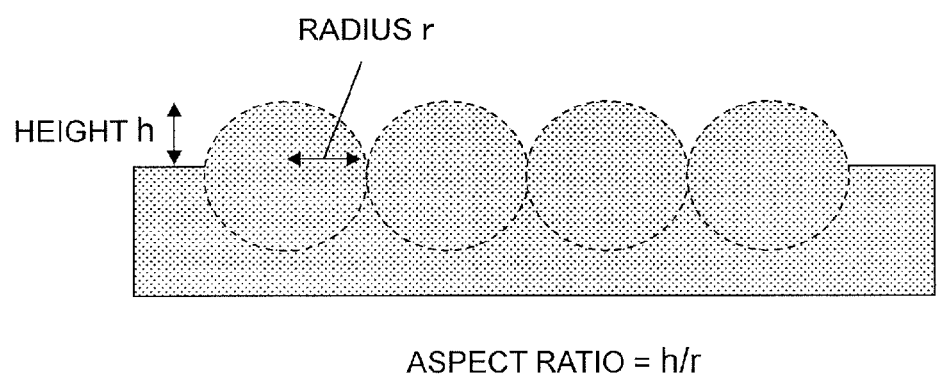
FIG. 5B A cross-sectional view taken along line A-A' in FIG. 5A.

FIG. 5A is a plan view showing the arrangement of a microlens array used for the experiment and calculation. FIG. 5B is a cross-sectional view taken along line A-A' in FIG. 5A. When disposed in a honeycomb arrangement shown in FIG. 5A, the microlens array on the surface of the external light-extraction layer 16 attains a close-packed structure, thereby maximizing the light extraction efficiency. Herein, the aspect ratio was set to h/r=1.0, given the radius r of each microlens and the amount of protrusion (height) h of each sphere.

Figure 6A:
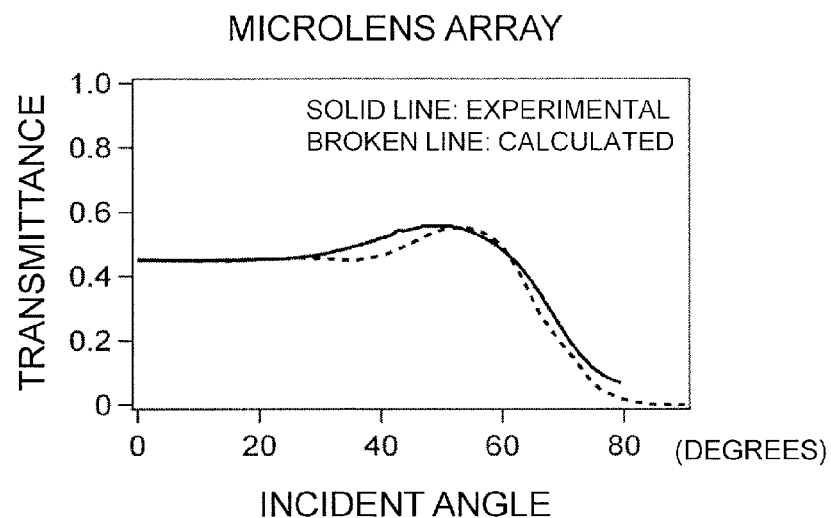
FIG. 6A A diagram showing incident angle dependence of transmittance in the case where a microlens array is used as an external light-extraction layer.
Figure 6B:
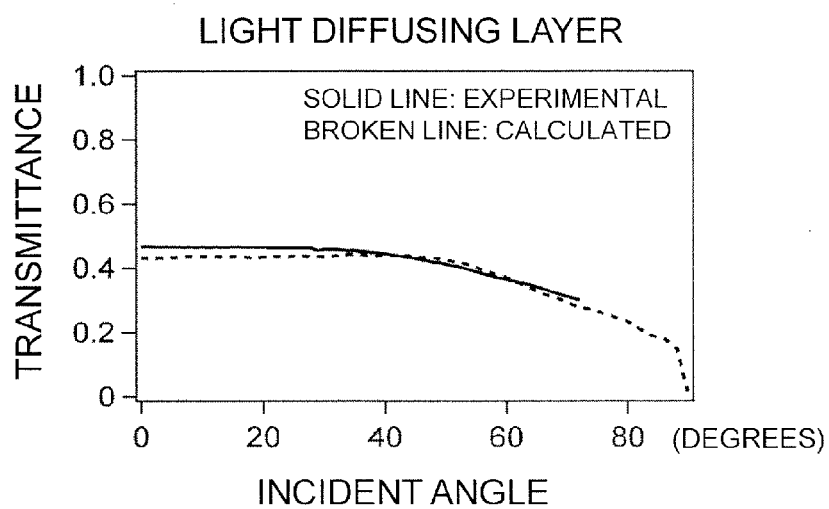
FIG. 6B A diagram showing incident angle dependence of transmittance in the case where a light diffusing layer is used as an external light-extraction layer.

FIG. 6A and FIG. 6B are graphs showing results of the aforementioned experiment and calculation. FIG. 6A shows results with respect to the microlens array film, whereas FIG. 6B shows results with respect to the diffusion-type film. In the graph of each figure, a solid line indicates results of experimental measurement, and a broken line indicates results of ray tracing calculation. In both cases, the experimental results and the calculation results match well. As shown in FIG. 6A, for the microlens array, a transmittance peak exists at an incident angle between 40 degrees and 60 degrees, with the transmittance steeply decreasing from 60 degrees to 90 degrees. On the other hand, as shown in FIG. 6B, for the diffusion-type film, the transmittance gently decreases from 0 degrees to 90 degrees. When both are compared, the transmittance between 0 degrees and 40 degrees is substantially equal; the transmittance between 40 degrees and 60 degrees is higher for the microlens array; and the transmittance between 60 degrees and 80 degrees is higher for the diffusion-type film.

Figure 6C:
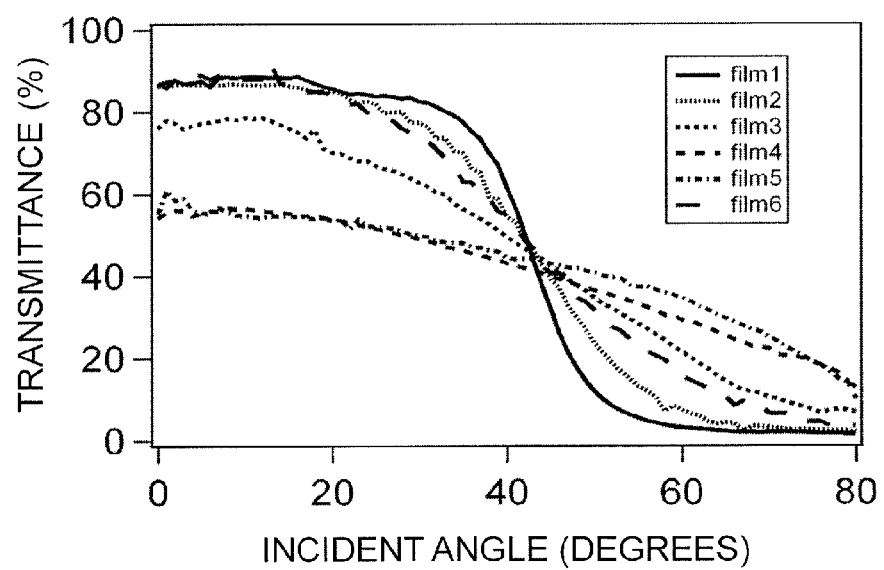
FIG. 6C A diagram showing incident angle dependence of transmittance in the case where a light diffusing layer is used as an external light-extraction layer.

FIG. 6C is a graph showing results of measuring transmittance for different incident angles, with respect to six kinds of diffusion-type films according to various design conditions. As indicated by this graph, when an external light-extraction layer 16 of a diffusion-type is used, a transmittance peak occurs in a region of smaller incident angles, while the light arriving at an incident angle of 40 degrees to 60 degrees does not experience such high transmittance.

The inventors have paid attention to the idiosyncratically-high transmittance between 40 degrees and 60 degrees in the case where a microlens array is used. We have arrived at the concept that the overall light extraction efficiency of the organic EL device 100 can be enhanced by, when extracting light from the emission layer 12 with the internal light-extraction layer 15, allowing a lot of light to concentrate in a range of incident angles from 40 degrees to 60 degrees, while suppressing any light between 60 degrees and 80 degrees.

[2-2. Analysis of Angular Distribution of Light Incident on External Light-Extraction Layer 16]

However, in order to apply this concept in adjusting the direction in which light strikes the external light-extraction layer 16, the angular distribution of the light that strikes the external light-extraction layer 16 needs to be known in the first place. Therefore, the inventors have measured an angular distribution of light under the construction shown in FIG. 7. In the construction shown in FIG. 7, instead of the external light-extraction layer 16 of the organic EL device 100 in FIG. 1, a hemispherical lens which is sufficiently larger than the organic EL device 100 is attached. Herein, the hemispherical lens has substantially the same refractive index as the refractive index of the transparent substrate 14. With this construction it is possible to measure an angular distribution of light going out from the transparent substrate 14, because, without being refracted, light is extracted into the air layer via the hemispherical lens from the transparent substrate 14. A spectroradiometer was used for the light distribution measurement, which was placed so as to receive light from a light spot spanning a sufficiently small region of the emission layer 12.

Figure 8A:
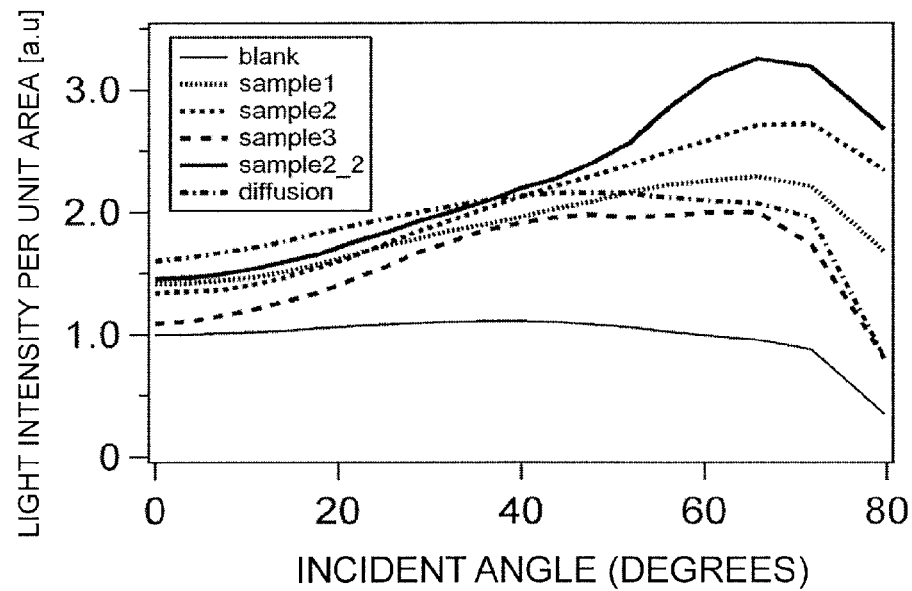
FIG. 8A A graph showing incident angle dependence of light intensity per unit area in several prototyped devices.
Figure 8B:
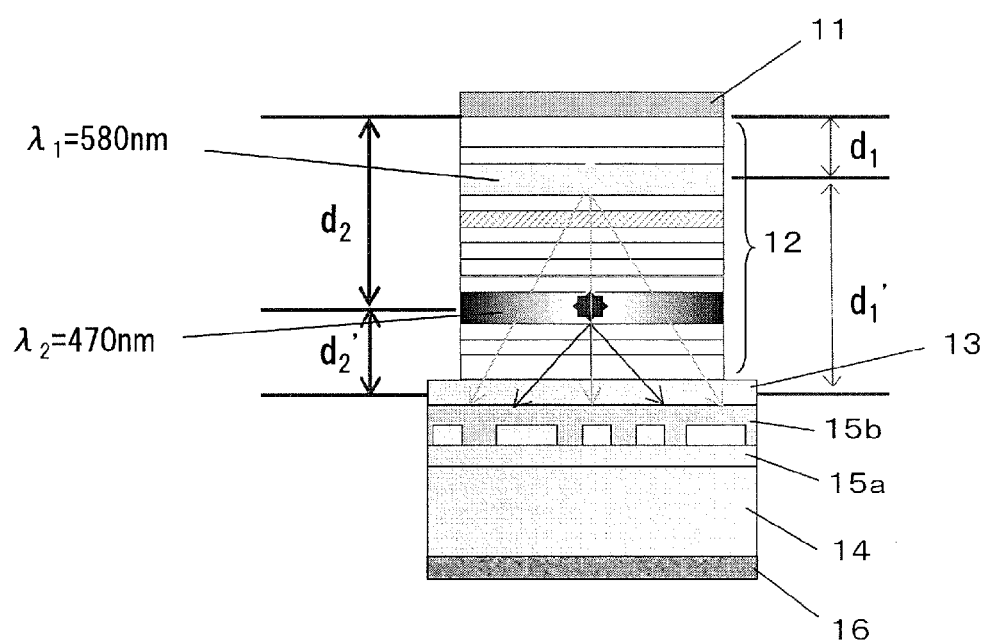
FIG. 8B A diagram showing the construction of a prototyped device.

The aforementioned measurement was performed for several prototyped samples of organic EL devices. The results are shown in FIG. 8A. In the graph of FIG. 8A, the horizontal axis represents incident angle, and the vertical axis represents measured light intensity (arbitrary unit) per unit area. As a sample construction, constructions as shown in FIG. 8B and Table 1 below were adopted.

TABLE 1

|  | d1 (nm) | d1' (nm) | d2 (nm) | d2' (nm) | bump-dent structure |
|---|---|---|---|---|---|
| Sample 1 | 56 | 312 | 168 | 200 | Random 1 w = 0.6 μm |
| Sample 2 | 104 | 264 | 168 | 200 | Random 1 w = 0.6 μm |
| Sample 2_0 | 104 | 264 | 168 | 200 | None |
| Sample 2_1 | 104 | 264 | 168 | 200 | Scatter-type |
| Sample 2_2 | 104 | 264 | 168 | 200 | Random 2 w = 1.2 μm |
| Sample 3 | 104 | 264 | 207 | 161 | Random 1 w = 0.6 μm |

Herein, glass with a refractive index of 1.51 was used as the transparent substrate 14, and ITO was used as the transparent electrode 13. As the organic emission layer 12, a multilayer structure including two layers respectively emitting light of average wavelengths $\lambda 1=580$ nm and $\lambda 2=470$ nm was adopted. As used herein, an average wavelength is defined so that, in the emission spectrum, a sum of intensities of light of any wavelengths greater than the average wavelength is equal to a sum of intensities of light of any wavelengths smaller than the average wavelength. The positions of the two emission layers in each sample are as indicated in Table 1, where the distance from the reflection electrode 11 to the layer emitting light of an average wavelength $\lambda 1$ is denoted as d1; the distance from this layer to the transparent electrode 13 is denoted as d1'; the distance from the reflection electrode 11 to the layer emitting light of a wavelength $\lambda 2$ is denoted as d2; and the distance from this layer to the transparent electrode 13 is denoted as d2'. As for the internal light-extraction layer 15, a resin with a refractive index of 1.52 was used as the material of the low-refractive index layer 15a and a resin with a refractive index of 1.76 was used as the material of the high-refractive index layer 15b, and a bump-dent structure was formed at the interface therebetween. As the bump-dent structure, two patterns shown in FIGS. 9(a) and (b) were used.

Figure 9:
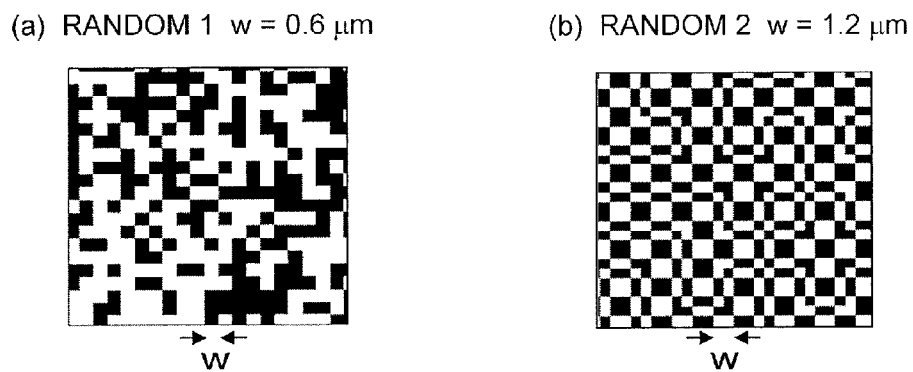
FIG. 9 A diagram showing in (a) and (b) bump-dent structures in prototyped devices.

Among Samples 1, 2 and 3, the relative positioning of the two emission layers and the two electrodes is varied, but the bump-dent structure is always the random structure (Random 1) shown in FIG. 9(a). Sample 2_2 has the two emission layers disposed in the same positions as in Sample 2, but the bump-dent structure is changed to the structure (Random 2) shown in FIG. 9(b). The structure of Random 1 is a random arrangement of two kinds of blocks having a width of 0.6 μm and a level difference of 0.6 μm. On the other hand, the structure of Random 2 is a random arrangement of two kinds of blocks having a width of 1.2 μm and a level difference of 0.6 μm. In Random 2, however, randomness is reduced so that no three or more blocks of the same kind successively appear along the lateral direction or the vertical direction in FIG. 9(b). As a comparative example, measurements were also taken of Sample 2_0, which had the internal light-extraction layer 15 excluded from the construction of Sample 2, and Sample 2_1, which featured a scatter-type internal light-extraction layer instead of the bump-dent structure in the construction of Sample 2. Herein, a scatter-type internal light-extraction layer means a device which is formed by injecting high-refractive index particles near the boundary between the low-refractive index layer 15a and the high-refractive index layer 15b.

As shown in FIG. 8A, in Sample 2_0 (blank) lacking the internal light-extraction layer 15, the light intensity does not change much against the incident angle. On the other hand, in the other samples including the internal light-extraction layer 15, including Sample 2_1 (diffusion) featuring a diffusion-type internal light-extraction layer, light intensity increases mainly at the higher angle side, with a light intensity peak between 60 degrees and 80 degrees. Since this tendency is observed irrespective of the construction of the emission layer 12, it can be said that the internal light-extraction layer 15 is responsible for this effect of extracting light mainly at the higher angle side. As shown in FIG. 8A, the tendency of increasing light intensity on the higher angle side is more outstanding when an internal light-extraction layer having a bump-dent structure is used than when a scatter-type internal light-extraction layer is used. This tendency is particularly outstanding in Sample 2_2 with reduced randomness.

The above results indicate that, with the internal light-extraction layer 15 being introduced, light which arrives at the external light-extraction layer 16 from the transparent substrate 14 at an incident angle of 60 degrees to 80 degrees is greater in intensity. Therefore, even if such an organic EL device adopted a microlens array which provides an idiosyncratically high transmittance for light of incident angles between 40 degrees and 60 degrees as the external light-extraction layer 16, it would not immediately improve the light extraction efficiency.

[2-3. Studying Construction of Internal Light-Extraction Layer 15]

[2-3-1. Studying Construction of Low-Refractive Index Layer 15a]

Figure 10:
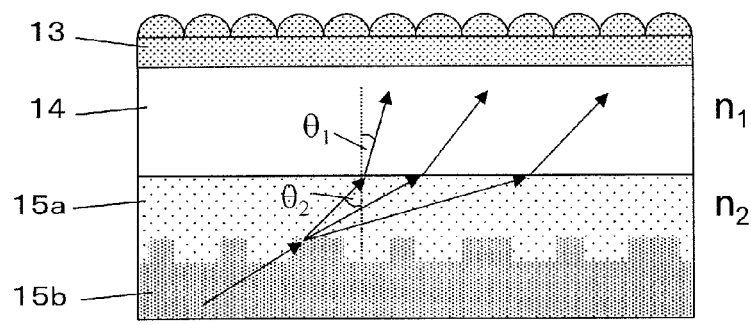
FIG. 10 A diagram for explaining Snell's law.

Therefore, the inventors explored the possibility of modifying the construction of the internal light-extraction layer 15 so as to shift the incident angle at which light outgoing from the transparent substrate 14 has an intensity peak. Specifically, we explored the possibility of employing for the low-refractive index layer 15a a material having a lower refractive index than that of the material used for the transparent substrate 14, thereby shifting the incident angle on the transparent substrate 14. By using this construction, as shown in FIG. 10, light is deflected by refraction as it propagates from the low-refractive index layer 15a to the transparent substrate 14, so that it is incident on the external light-extraction layer 16 at a lower incident angle. This change in the light angle through refraction is determined by Snell's law. Given a refractive index n1 of the transparent substrate 14, a refractive index n2 of the low-refractive index layer 15a, a refraction angle θ1, and an incident angle θ2, Snell's law is expressed as: n1 sin θ1=n2 sin θ2.

Figure 7:
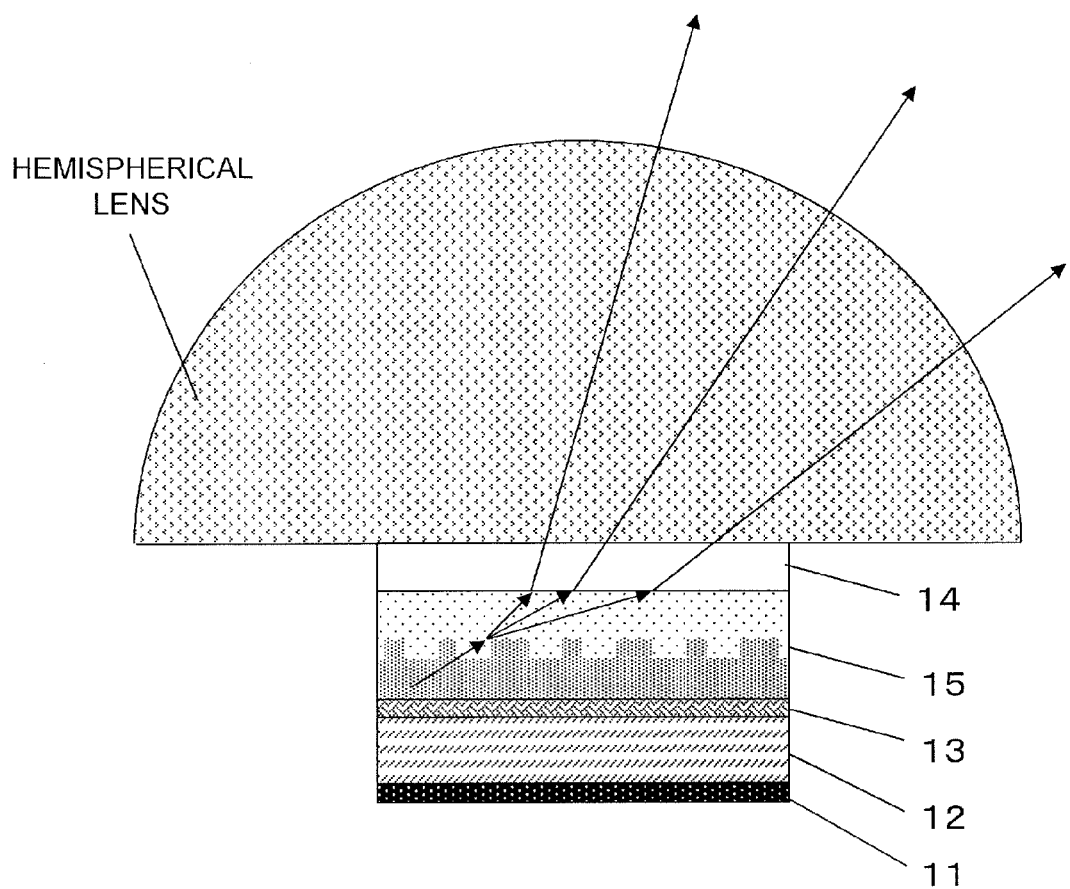
FIG. 7 A diagram showing a method of measuring an angular distribution with which light strikes an external light-extraction layer.
Figure 11:
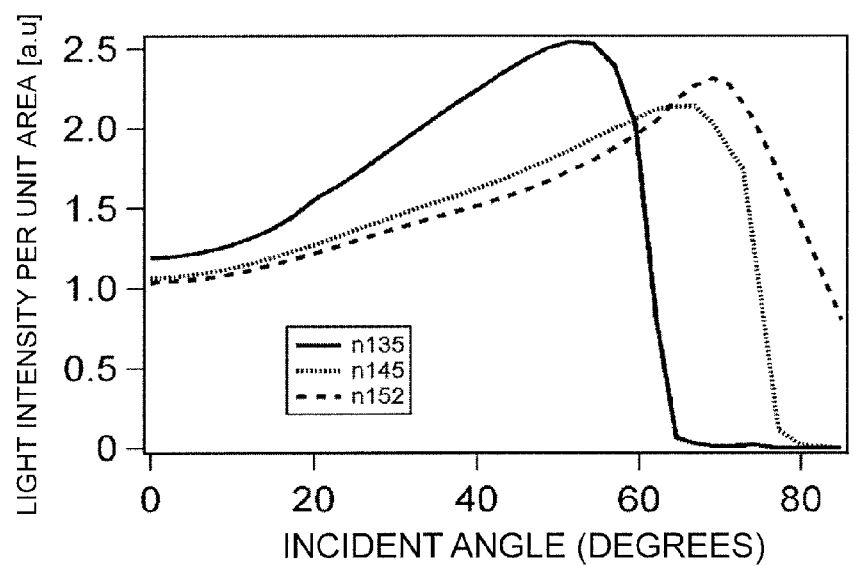
FIG. 11 A diagram showing incident angle dependence of light intensity where the refractive index of a low-refractive index layer is varied.

Based on the above concept, a plurality of devices including low-refractive index layers 15a with varying refractive indices were produced, and these devices were measured with respect to the angular distribution of light intensity inside the transparent substrate 14, with an arrangement as shown in FIG. 7. FIG. 11 is a graph showing the measurement results. In FIG. 11, a bold solid line, a dotted line, and a broken line respectively represent incident angle dependence of light intensity per unit area in the case where the low-refractive index layer 15a of the internal light-extraction layer 15 had refractive indices of 1.35, 1.45 and 1.52.

In the case where the low-refractive index layer 15a has a refractive index of 1.52 (which is similar to the refractive index of 1.51 of the transparent substrate), light exists at all angles from 0 degrees to 85 degrees, and concentrates around 70 degrees in particular. On the other hand, it can be seen that no light exists at 64 degrees or more when the low-refractive index layer 15a has a refractive index of 1.35 (which is smaller than the refractive index of 1.51 of the transparent substrate). Furthermore, through refraction from the low-refractive index layer 15a into the transparent substrate 14, light is deflected toward the lower angle side, so that more light is gathered in the range of 40 degrees to 60 degrees (see FIG. 6A), where the external light-extraction layer 16 (microlens array) has a high transmittance. Thus, by lowering the refractive index of the low-refractive index layer 15a in the internal light-extraction layer 15 so as to gather light in the high-transmittance angular region of the external light-extraction layer 16, it should become possible to enhance the overall extraction efficiency.

Figure 12:
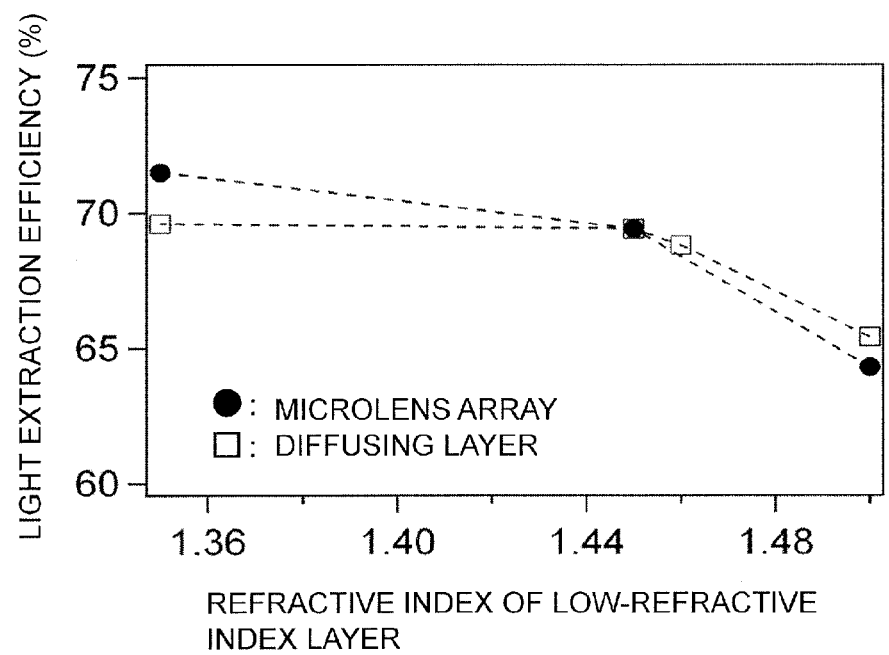
FIG. 12 Experimental results showing how dependence of light extraction efficiency on the refractive index of the low-refractive index layer may differ depending on whether a microlens array is used or a diffusing layer is used.

Based on the above results, the organic EL device 100 was prototyped in order to confirm the effects of combining the external light-extraction layer 16 (microlens array) and the internal light-extraction layer 15. The construction of the samples had a construction similar to that of FIG. 1. A glass with a refractive index of 1.51 was used as the transparent substrate 14; a resin with a refractive index of 1.76 was used as the material of the high-refractive index layer 15b; and ITO was used for the transparent electrode 13. The organic emission layer 12 was constructed so as to emit light of 440 nm to 700 nm (white light). As shown in FIGS. 2A and 2B, the bump-dent structure at the interface between the low-refractive index layer 15a and the high-refractive index layer 15b had a construction where two kinds of square-shaped unit structures (blocks) with a level difference (height) h and a width w were randomly arranged. Each block had a side length of w=0.6 and a height of h=0.6 μm. Efficiency of light extraction was measured for devices whose low-refractive index layers 15a had refractive indices of 1.35, 1.45, 1.47 and 1.52, where a film having a microlens array was used as the external light-extraction layer 16. As comparative examples, measurements were also taken of cases of using a film in which a light diffusing layer was provided as the external light-extraction layer 16. The low-refractive index layer 15a and the high-refractive index layer 15b had thicknesses of 1.5 μm and 2 μm, respectively. The results of light extraction efficiency measurement are shown in FIG. 12. In the graph of FIG. 12, the horizontal axis represents the refractive index of the low-refractive index layer 15a, and the vertical axis represents light extraction efficiency.

As shown in FIG. 12, when the refractive index of the low-refractive index layer 15a is higher than 1.45, the extraction efficiency is higher in the case where a diffusion-type film is attached; however, when the refractive index of the low-refractive index layer 15b is 1.45 or less, the efficiency is higher in the case where a microlens array film is attached. These results substantially match the results of prediction through calculation. Therefore, in the present embodiment, a construction where the low-refractive index layer has a refractive index which is lower than 1.45 and where a microlens array film is provided may be adopted.

Figure 13:
FIG. 13 A diagram showing an angular distribution of light from an emission layer, in light extraction efficiency calculation.

In order to further study the above effects, light extraction efficiency calculations were conducted. Again, calculations were performed separately for: examples in which a microlens array was used as the external light-extraction layer 16; and comparative examples in which a diffusion-type film was used. The transparent substrate 14 had a refractive index of 1.5; the low-refractive index layer 15a had a refractive index of 1.0 to 1.6; the high-refractive index layer 15b had a refractive index of 1.76; and their thicknesses were 0.7 mm, 2 μm and 2 μm, respectively. As the angular distribution of light in the emission layer 12, a distribution shown in FIG. 13 (which is data that was actually measured for separately produced samples) was adopted. The bump-dent structure was diffraction grating with a period of 2 μm and a height of 0.6 μm. As for the calculation algorithm, the Fourier modal method (RCWA method) was applied to the diffraction grating portion, and the results of this calculation and ray tracing results were taken in conjunction to calculate a light extraction efficiency of the entire organic EL device 100.

Figure 14:
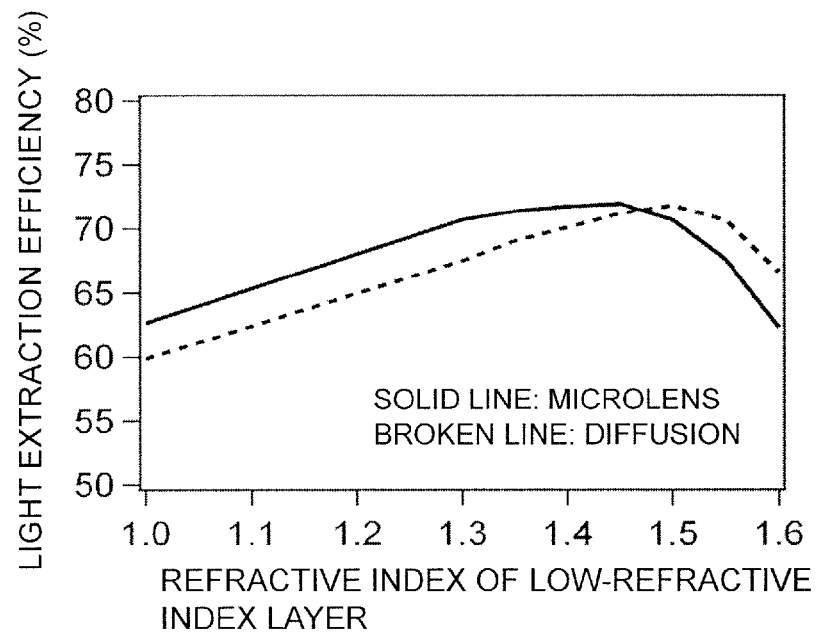
FIG. 14 Calculation results showing how dependence of light extraction efficiency on the refractive index of the low-refractive index layer may differ depending on whether a microlens array is used or a diffusing layer is used.

Calculation results indicating dependence of light extraction efficiency on the refractive index of the low-refractive index layer 15a are shown in FIG. 14. It can be seen that, when the refractive index of the low-refractive index layer 15a is lower than 1.47, a higher efficiency is obtained by using a microlens array as the external light-extraction layer 16 than a diffusion-type film. This behavior is about the same as the experimental results of FIG. 12. These results indicate that it is effective to adopt a construction where the refractive index of the low-refractive index layer 15a is lower than 1.47 and where a microlens is used as the external light-extraction layer 16.

Thus, the results indicate that, in the case where the refractive index n1 of the transparent substrate 14 is 1.5, a higher light extraction efficiency is obtained by using a microlens array than a diffusing layer if the refractive index n2 of the low-refractive index layer 15a is lower than 1.47. On the other hand, Snell's law would imply that similar effects should be obtained so long as the ratio between n1 and n2 is the same. Therefore, it is considered that effects similar to the above will be obtained whenever n2 is smaller than 0.98 (=1.47/1.5) times n1.

From the above analytic results, in the present embodiment, the refractive index n2 of the low-refractive index layer 15a is set to a smaller value than 0.98 times the refractive index n1 of the transparent substrate 14. However, without being limited to this example, certain effects will be obtained so long as the refractive index n2 of the low-refractive index layer 15a is smaller than the refractive index n1 of the transparent substrate 4.

[2-3-2. Studying Construction of High-Refractive Index Layer 15b]

Figure 15:
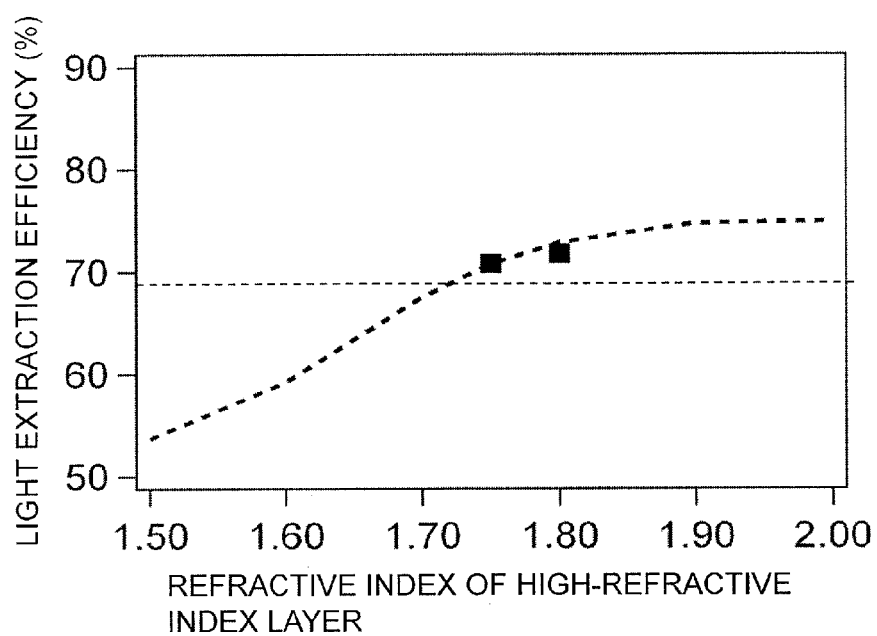
FIG. 15 A graph showing dependence of light extraction efficiency on the refractive index of the high-refractive index layer.

Through a calculation similar to the above, dependence of light extraction efficiency on the refractive index of the high-refractive index layer 15b was determined. Moreover, an experiment was conducted where two kinds of devices differing in the refractive index of the high-refractive index layer 15b were produced to measure the light extraction efficiencies thereof. These results are shown in FIG. 15. In the graph of FIG. 15, the horizontal axis represents the refractive index of the high-refractive index layer 15b, and the vertical axis represents light extraction efficiency. A broken line indicates calculation results, whereas rectangle markers indicate experimental results. In this calculation, the refractive index of the low-refractive index layer 15a was set to 1.45, while the other conditions of calculation were identical to the conditions of calculation in FIG. 14. On the other hand, the experiment was directed to two kinds of devices including high-refractive index layers 15b with refractive indices of 1.75 and 1.80, in a similar construction to that used in the experiment shown in FIG. 12 where the refractive index of the low-refractive index layer 15a was 1.45 and the external light-extraction layer 16 was a microlens array. As FIG. 15 indicates, the light extraction efficiency increases as the refractive index of the high-refractive index layer 15b increases.

On the other hand, in the experiment of FIG. 12, a light extraction efficiency of about 69% was obtained in the sample where the high-refractive index layer 15b had a refractive index of 1.76 and the low-refractive index layer 15a had a refractive index of 1.45. Against this efficiency, in order to achieve a construction with a higher extraction efficiency than in this sample, the refractive index of the high-refractive index layer 15b may be set to 1.73 or above.

[2-3-3. Construction of Bump-Dent Structure]

The bump-dent structure at the boundary between the low-refractive index layer 15a and the high-refractive index layer 15b can be formed by, for example, forming bump-dent features on the low-refractive index layer 15a, and thereafter filling up the dents and bumps with the high-refractive index material. When subsequently forming the transparent electrode 13, the organic emission layer 12, and the reflection electrode 11, short-circuiting is likely to occur between the transparent electrode 13 and the reflection electrode 11 if the surface of the high-refractive index layer 15b has poor planarity. In that case, the device may not be capable of being lit, thus resulting in a poor production yield during manufacture. Thus, in the present embodiment, a construction is adopted which can minimize the height of the bump-dent features, thus to ensure planarity after filling with the high-refractive index layer 15b. Moreover, lowering the height of the bump-dent structure in this manner also makes it possible to reduce the amounts of materials used of the low-refractive index layer 15a and the high-refractive index layer 15b, thus providing for low cost.

On the other hand, from the standpoint of improving the light extraction efficiency, the height (size) of the bump-dent structure needs to be at least on the order of ¼ times the wavelength of light. This will ensure sufficient optical phase differences for diffracting light, whereby the light-extracting efficiency can be improved. From the above standpoints, in the present embodiment, a diffraction grating with a random structure or a periodic structure, etc., having a height (size) around 1 μm, is adopted as an exemplary bump-dent structure.

Light which has traveled through the bump-dent structure is incident on the low-refractive index layer 15a. If the thickness of the low-refractive index layer 15a is ½ or less of the wavelength of light, light will not propagate through the low-refractive index layer 15a, but will be transmitted through the transparent substrate 14 via an evanescent field, so that the effect of deflecting light toward the lower angles with the low-refractive index layer 15a is no longer expectable. Thus, the thickness of the low-refractive index layer 15a according to the present embodiment may be set to ½ times or more of the average emission wavelength.

[2-3-4. Material and Production Method of Internal Light-Extraction Layer 15]

When the refractive index of the high-refractive index layer 15b is set to 1.73 or more as mentioned above, the material for the high-refractive index layer 15b may be, for example: an inorganic material with a relatively high refractive index, e.g., ITO (indium tin oxide), $TiO_2$ (titanium oxide), SiN (silicon nitride), $Ta_2O_5$ (tantalum pentoxide), or $ZrO_2$ (zirconia); a high-refractive index resin; or the like.

It is commonplace to use glass, resin, and the like as the transparent substrate 14, which have refractive indices on the order of 1.5 to 1.65. Therefore, as the material of the low-refractive index layer 15a, inorganic materials such as glass and $SiO_2$ (quartz), and resins and the like can be used.

As the method of forming the internal light-extraction layer 15, a low-refractive index layer 15a whose surface has bump-dent features may be formed on the transparent substrate 14, for example, and the bump-dent structure may be filled up with a high-refractive index material from above, whereupon the transparent electrode 13, the organic emission layer 12, and the reflection electrode may be formed. In another method, the reflection electrode 11 may be formed on a substrate; the organic emission layer 12, the transparent electrode 13, and a high-refractive index layer 15b whose surface has bump-dent features may be formed thereupon; the bump-dent structure may be filled with a low-refractive index material from above; and the transparent substrate 14 may be formed thereupon.

When inorganic materials are used as the materials of the low-refractive index layer 15a and the high-refractive index layer 15b, a relatively high-cost technique such as cutting or a semiconductor process will generally be required. On the other hand, when the aforementioned resin materials are used as the materials of the low-refractive index layer 15a and the high-refractive index layer 15b, it is possible to form the internal light-extraction layer 15 by a relatively low-cost technique, such as application, nanoimprint, and spin-coating.

[2-3-5. Detailed Analysis of External Light-Extraction Layer 16]

Figure 16:
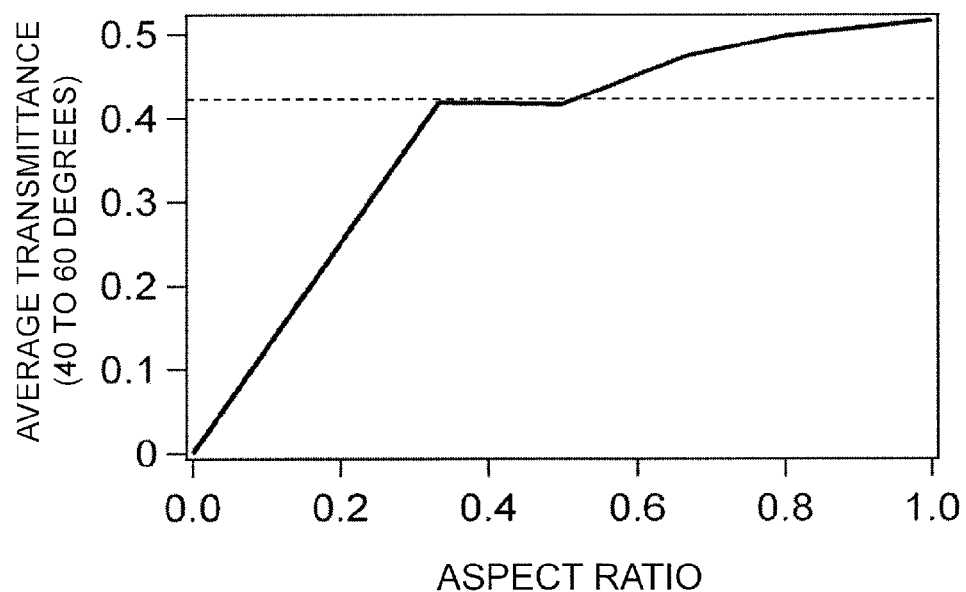
FIG. 16 A graph showing dependence, on the aspect ratio of microlenses, of transmittance of light at an incident angle from 40 to 60 degrees.

As described above, in the present embodiment, a microlens array as shown in FIGS. 5A and 5B is used as the external light-extraction layer 16. Adopting the honeycomb arrangement shown in FIG. 5A would attain a close-packed structure, thus maximizing the light extraction efficiency. With respect to this arrangement, FIG. 16 shows changes in the transmittance of incident light at an incident angle of 40 degrees to 60 degrees when the amount of protrusion (height h) of the sphere of each microlens is varied. In the graph of FIG. 16, the horizontal axis represents the aspect ratio (=height h/sphere radius r), and the vertical axis represents the average transmittance of light at an incident angle of 40 degrees to 60 degrees. It can be seen that the average transmittance increases as the aspect ratio increases, such that the structure with an aspect ratio of one (i.e., a structure with hemispheres) has the highest transmittance. The transmittance indicated by a broken line (=42%) represents the value of average transmittance of light which is incident on the diffusion-type film at an incident angle of 40 degrees to 60 degrees as shown in FIG. 6B. As can be seen from the results of FIG. 16, it is when the aspect ratio is 0.5 or above that a transmittance of 42% is exceeded at all.

Figure 17:
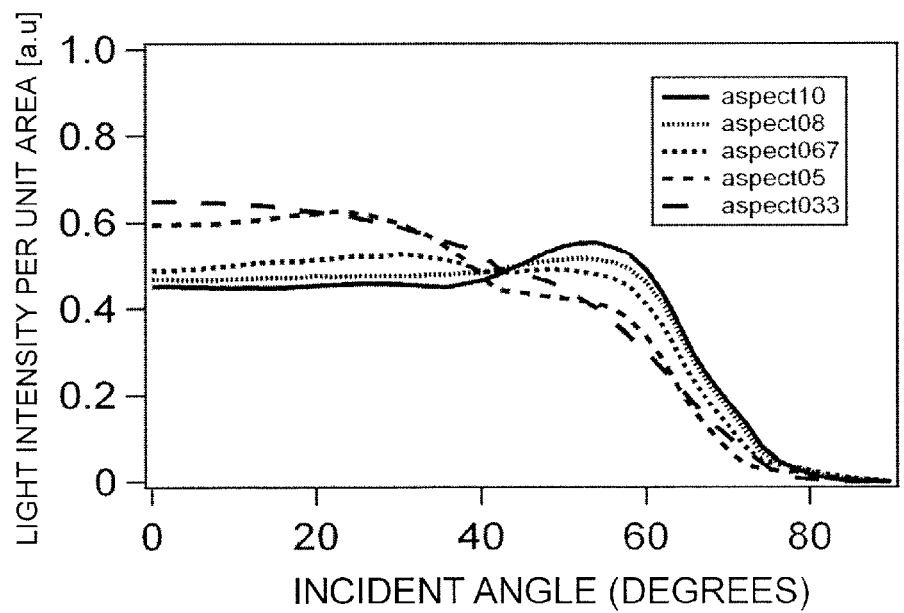
FIG. 17 A graph showing dependence of light intensity on the incident angle, where the aspect ratio is varied.

FIG. 17 is a graph showing incident angle dependence of light intensity per unit area in the cases where the aspect ratio is 0.33, 0.5, 0.67, 0.8 and 1.0. As this figure indicates, the light intensity peak at an incident angle of 40 degrees to 60 degrees becomes more conspicuous as the aspect ratio approaches 1.0.

Figure 18:
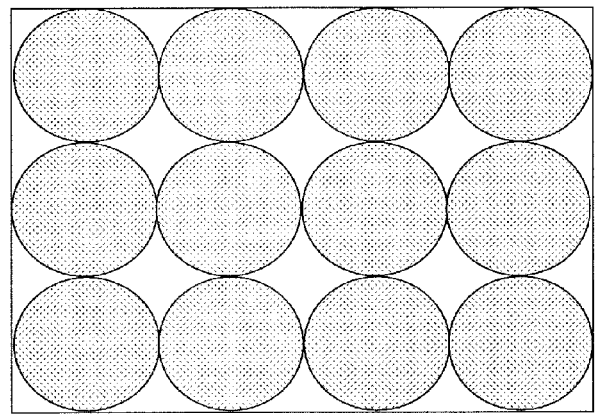
FIG. 18 A diagram showing a variant microlens array.
Figure 19:
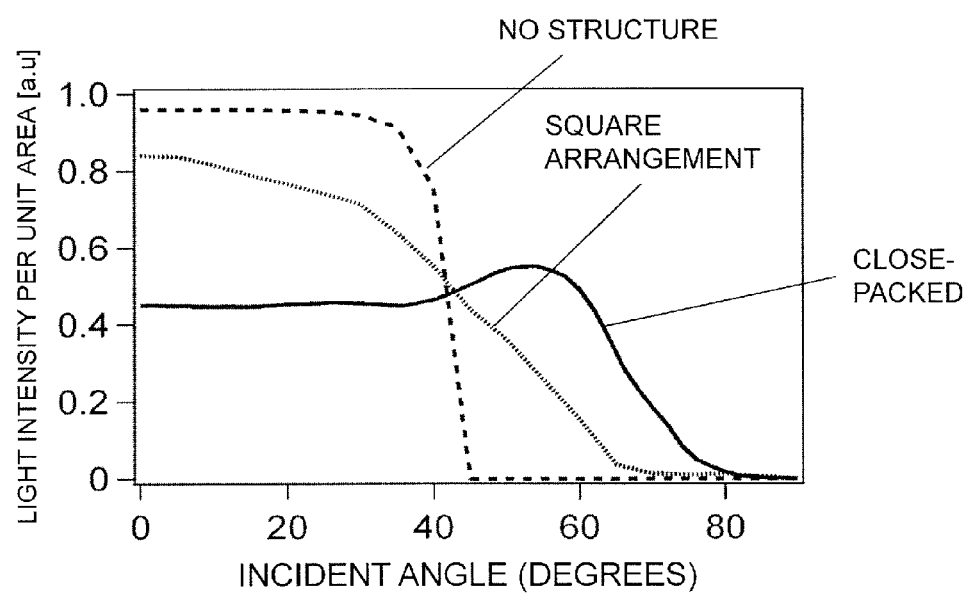
FIG. 19 A graph showing changes in the incident angle dependence of light intensity under different constructions of the external light-extraction layer.

For comparison, dependence of light transmittance on the incident angle was also studied for the case where a microlens array of a square arrangement as shown in FIG. 18 was used as the external light-extraction layer 16 and for the case where no microlens array was provided. FIG. 19 is a graph showing results of this comparison. In FIG. 19, the horizontal axis represents incident angle, and the vertical axis represents light intensity per unit area. A solid line indicates results of the close-packed case illustrated in FIG. 5A; a dotted line indicates results of the square arrangement illustrated in FIG. 18; and a broken line indicates results where no microlens array is provided. As indicated by the graph of FIG. 19, it is only the case under the close-packed microlenses that the transmittance of light at an incident angle of 40 degrees to 60 degrees becomes idiosyncratically large.

[3. Variants]

[3-1. Variant of External Light-Extraction Layer 16]

The present embodiment has illustrated a microlens array as an example of the external light-extraction layer 16. The microlens array in the present embodiment has a transmittance peak for light at incident angles ranging from 40 degrees to 60 degrees. Therefore, by combining a microlens array and the internal light-extraction layer 15 including the low-refractive index layer 15a whose refractive index is relatively low, a higher efficiency can be provided over other constructions. Without being limited to a microlens array, this effect can be similarly obtained with any external light-extraction layer 16 that is arranged so that light arriving at an incident angle of 40 degrees to 60 degrees has a transmittance peak. Thus, a variant of the external light-extraction layer 16 will be described below.

Figure 20A:
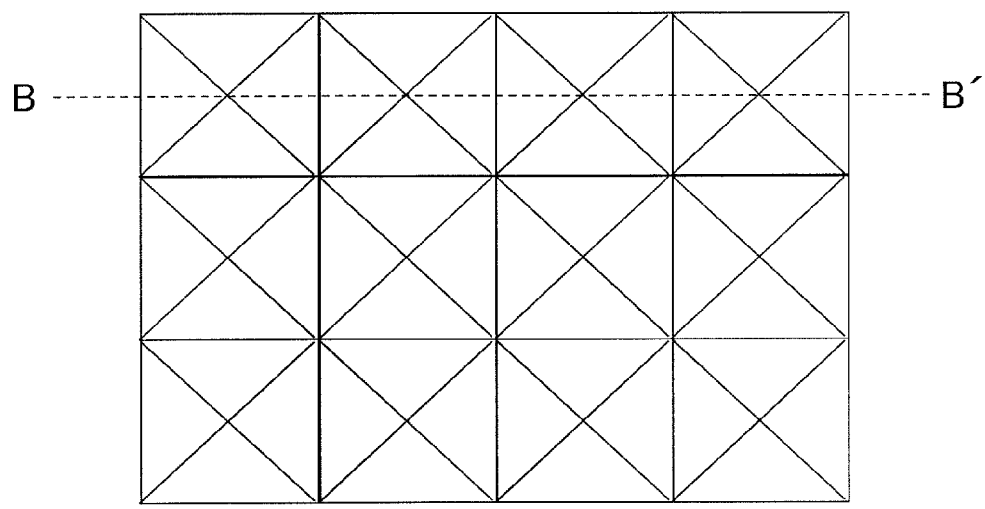
FIG. 20A A plan view showing an example where pyramidal structures are adopted for the external light-extraction layer.
Figure 20B:
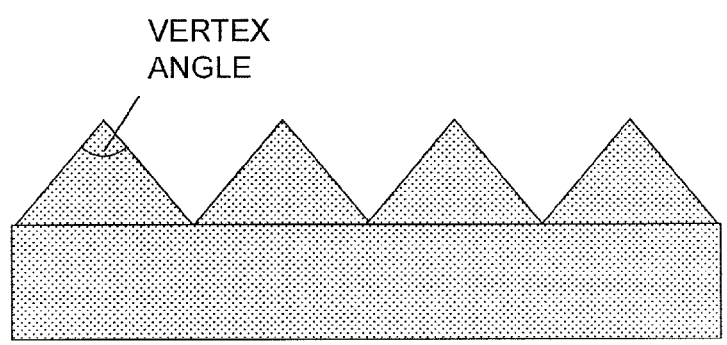
FIG. 20B A cross-sectional view taken along line B-B' in FIG. 20A.
Figure 21:
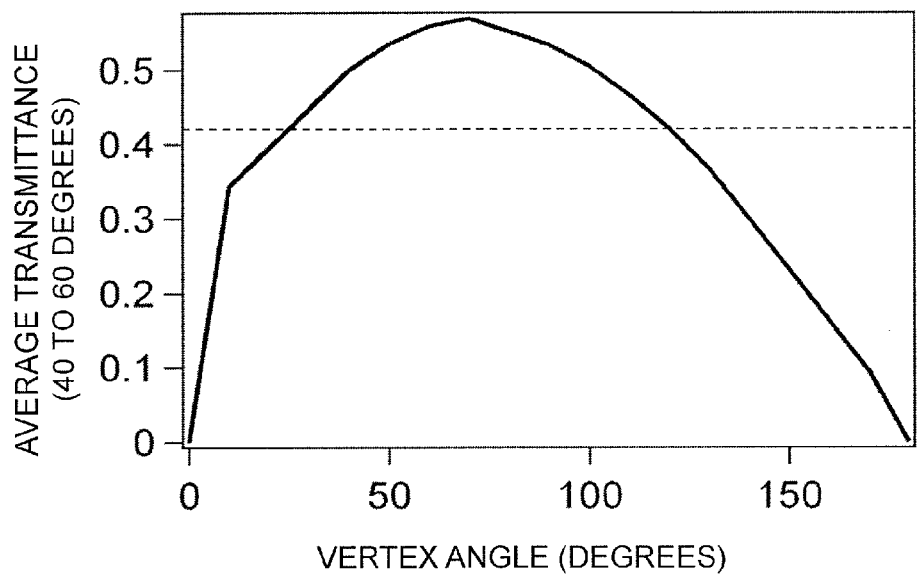
FIG. 21 A graph showing dependence of transmittance of light at an incident angle from 40 to 60 degrees on the vertex angle in the case where pyramidal structures are adopted.

FIG. 20A is a plan view showing pyramidal structures as a similar configuration to a microlens array. FIG. 20B is a cross-sectional view taken along line B-B' in FIG. 20A. FIG. 21 is a graph showing dependence of an average value of transmittance of light at an incident angle from 40 to 60 degrees on the vertex angle of each pyramidal structure. The transmittance indicated by a broken line (=42%) represents the value of average transmittance of light which is incident on the diffusion-type film at an incident angle of 40 degrees to 60 degrees as shown in FIG. 6B. It can be seen from the results of FIG. 21 that, within a vertex angle range from 30 degrees to 120 degrees, the average transmittance of light at an incident angle of 40 degrees to 60 degrees is higher than in the case of using a diffusion-type film.

Figure 22:
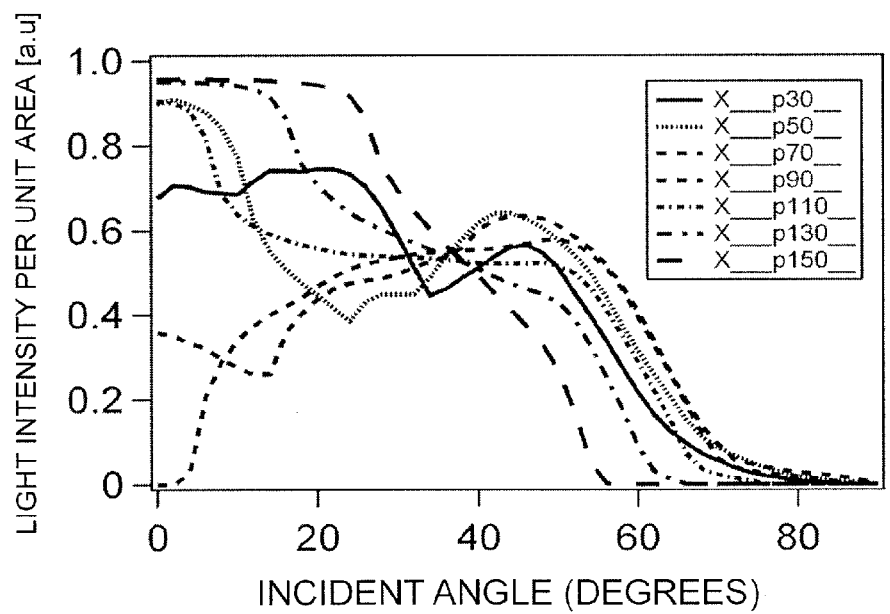
FIG. 22 A graph showing changes in light intensity where the vertex angle of each pyramidal structure is varied.

FIG. 22 is a graph showing incident angle dependence of light intensity per unit area in the respective cases where each pyramidal structure has vertex angles of 30 degrees, 50 degrees, 70 degrees, 90 degrees, 110 degrees, 130 degrees and 150 degrees. From these results, too, it can be seen that light at an incident angle of 40 degrees to 60 degrees has a relatively high average transmittance when the vertex angle is in the range from 30 degrees to 120 degrees. Therefore, in the case of adopting a pyramidal-structured array for the external light-extraction layer 16, the vertex angle may be set in a range from 30 degrees to 120 degrees.

[3-2. Variant of Bump-Dent Structure]

Next, a variant of the bump-dent structure will be described.

Figure 23:
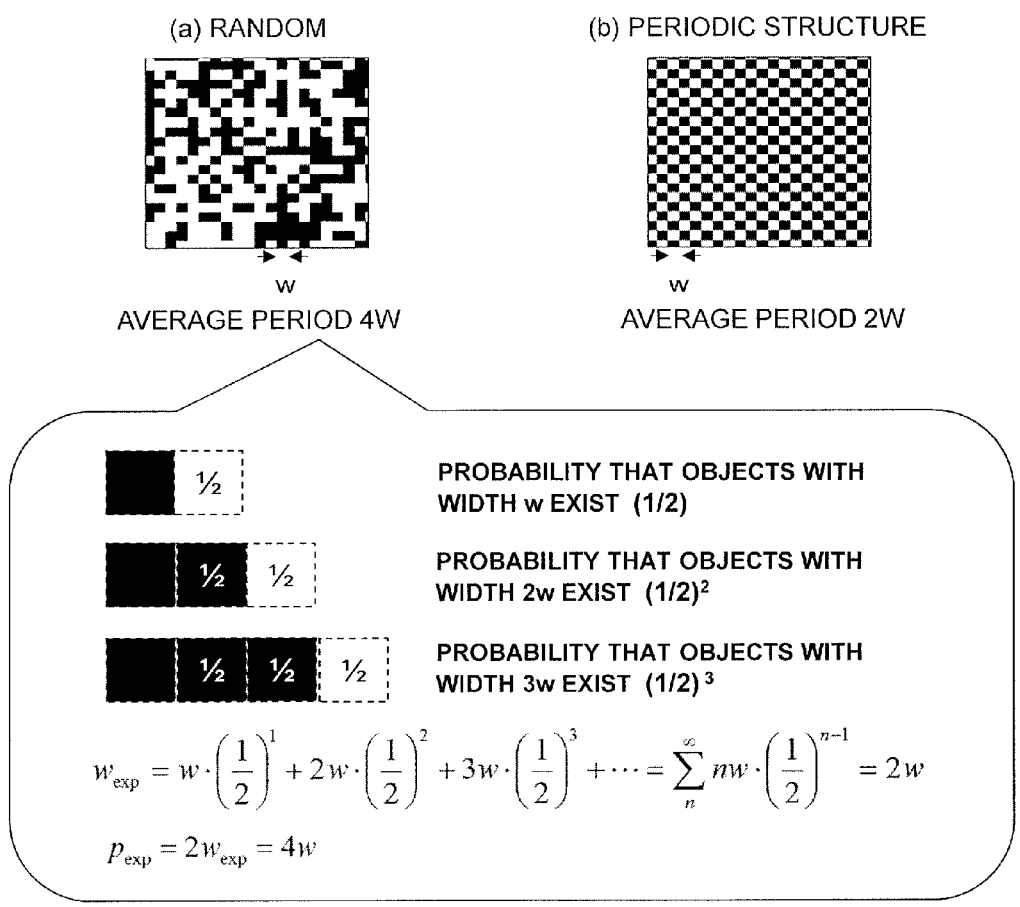
FIG. 23 Diagrams (a) and (b) for explaining the period of a bump-dent structure.

First, with reference to FIG. 23, the principle behind a bump-dent structure will be described. When two kinds of unit structures (blocks) with a width w are randomly arrayed, there will be an average period of 4w along the arrangement direction in which they are arrayed. On the other hand, when blocks with a width w are periodically arrayed, there will be an average period of 2w along the direction in which they are arrayed. Note that an average period $p_{exp}$ when blocks are randomly arrayed can be determined by a calculation which is indicated in a balloon in FIG. 23.

In the present embodiment, a bump-dent structure with controlled randomness can be adopted. A "structure with controlled randomness" means a structure whose randomness is reduced so that no blocks of the same kind successively appear a predetermined number of times or more along one direction, rather than a completely random structure. As has been described with reference to FIG. 8A, by adopting a bump-dent structure with controlled randomness, it becomes possible to further improve the light extraction efficiency.

Figure 24:
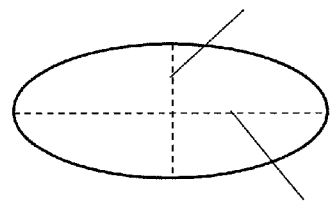
FIG. 24 Another diagram for explaining the period of a bump-dent structure.
Figure 24:
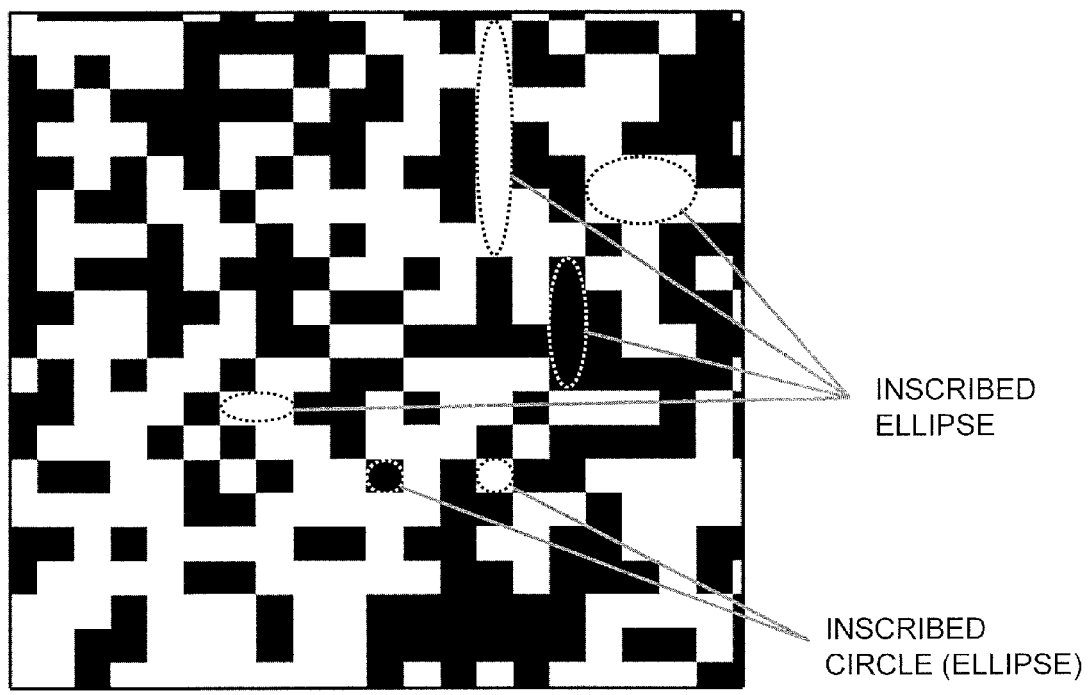

In a structure with controlled randomness, too, an average period can be determined based on a similar principle to the above. A method of determining an average period from the pattern of a structure is shown in FIG. 24. Ellipses will now be considered, each being inscribed in a region consisting of successive unit structures of the same kind, with respect to both of the lateral direction and the vertical direction in FIG. 24. In the lower diagram of FIG. 24, an average value of the sizes of the white portions can be determined by calculating an average value of the axial lengths of ellipses which are inscribed in the white portions. Herein, an "axial length" refers to the length a of the minor axis or the length b of the major axis as illustrated in the upper diagram of FIG. 24. The same also applies to the black portions. An average period is defined by a value obtained by taking a sum of these average values.

Figure 25:
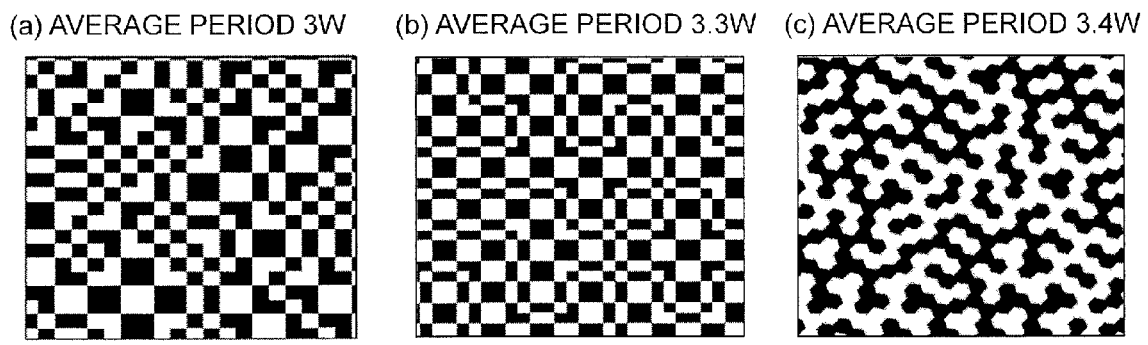
FIG. 25 (a) is a diagram showing a first example of a bump-dent structure; (b) is a diagram showing a second example of a bump-dent structure; and (c) is diagram showing a third example of a bump-dent structure.

FIGS. 25 (a) to (c) are diagrams showing examples of bump-dent structures with controlled randomness (with average periods of 3w, 3.3w and 3.4w, respectively). As shown in FIG. 25(c), a bump-dent structure may be a structure including an array of blocks of shapes other than squares, e.g., hexagons.

Figure 26:
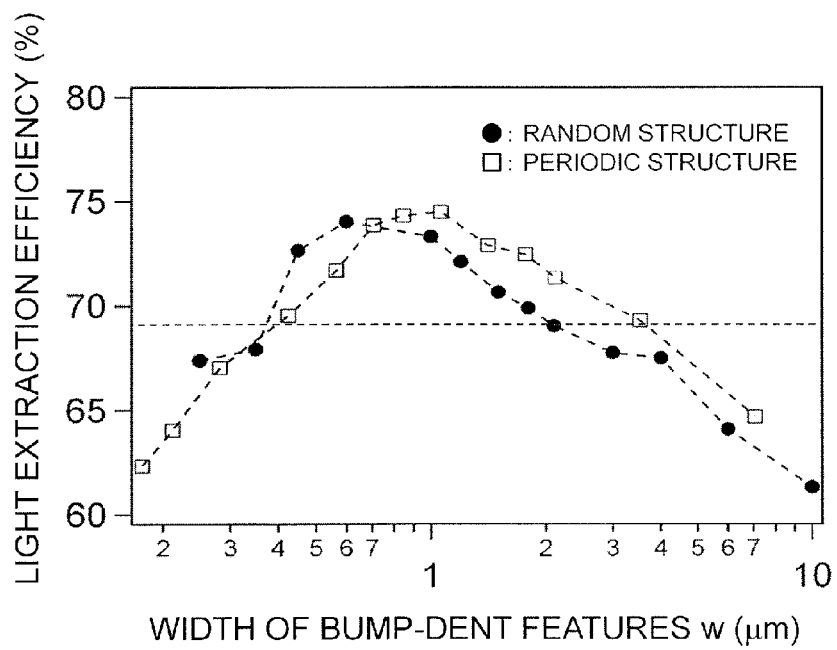
FIG. 26 A graph showing dependence of light extraction efficiency on the width of bump-dent features.

FIG. 26 is a graph showing results of calculating dependence of light extraction efficiency on the width w of the bump-dent features. Herein, the height h of the structure is 1.0 μm. The transparent substrate 14 has a refractive index of 1.5; the low-refractive index layer 15a has a refractive index of 1.35; and the high-refractive index layer 15b has a refractive index of 2.0. In the figure, (●) indicates results when adopting bump-dent features composed of randomly-arrayed blocks as shown in FIG. 23(a), and (□) indicates results when adopting bump-dent features composed of periodically-arrayed blocks as shown in FIG. 23(b). In the case of adopting a random structure, a light extraction efficiency of 69% or more can be obtained so long as w is in the range from 0.4 to 2 μm. In the case of adopting a periodic structure, a light extraction efficiency of 69% or more can be obtained so long as w is in the range from 0.4 to 4 μm.

Light is not diffracted by any structure that is sufficiently smaller than its wavelength. Therefore, regardless of a random structure or a periodic structure, it will not be effective to array unit structures that are 400 nm or less. Given an average wavelength λ of light occurring from the emission layer 12, w may be set to 0.73λ (=λ×400/550) or more, for example. On the other hand, it has been found that, in any region with unit structures that are sufficiently larger than the wavelength, a light extraction efficiency of 69% or more can be obtained by setting w to 2 μm or less for a random structure, or setting w to 4 μm or less for a periodic structure. Since a random structure has an average period of 4w and a periodic structure has an average period of 2w, it will be understood that the light extraction efficiency is governed by the average period, irrespective of the pattern of the structure. The average period, p, may be set to 8 μm or less, for example. Moreover, from the principle of light diffraction, a diffraction pattern of light is determined by a ratio between the structure size (period) and the light wavelength (i.e., p/λ); therefore, the average period p may be set to 14.5(=8/0.55)λ or less, for example.

There is not much difference in light extraction efficiency between a random structure and a periodic structure. However, it is considered that a periodic structure will have large wavelength dependence due to the nature of a diffraction grating, thus resulting in a large color unevenness with respect to the viewing angle. Therefore, in order to reduce color unevenness with respect to the viewing angle, features composed of randomly arrayed structures may be adopted as the bump-dent features.

Figure 27:
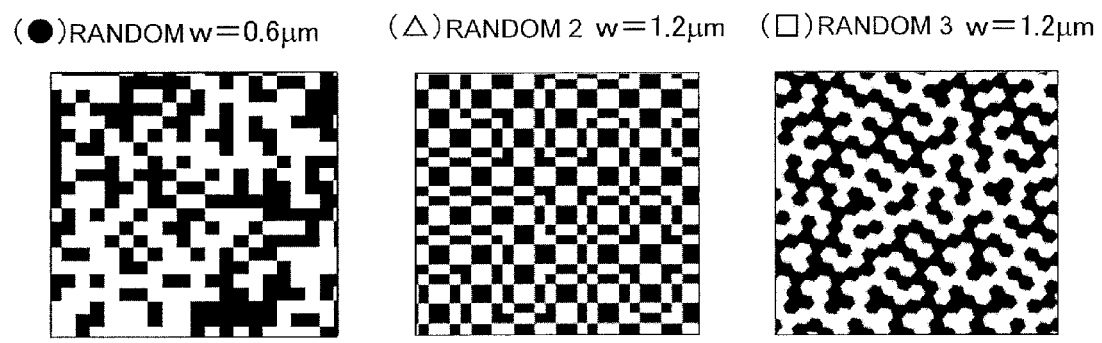
FIG. 27 Diagrams (a) - (c) showing exemplary bump-dent structures with controlled randomness.
Figure 28:
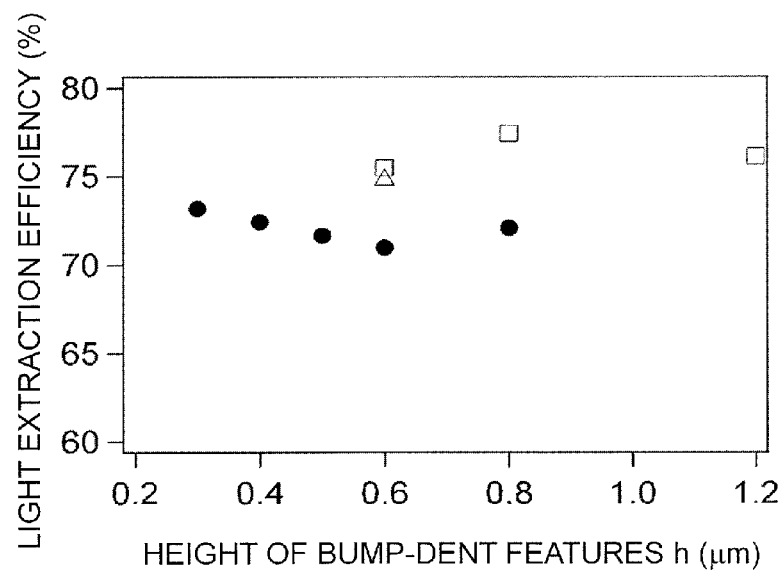
FIG. 28 A graph showing dependence of light extraction efficiency on the height h of a bump-dent structure, and dependence of light extraction efficiency on the degree of randomness.

Next, with reference to FIG. 27 and FIG. 28, dependence of light extraction efficiency on the height h of the bump-dent structure and dependence of light extraction efficiency on the degree of randomness will be described. Samples of organic EL devices having three kinds of bump-dent structures as shown in FIG. 27 were prototyped, and their respective light extraction efficiencies were measured. FIG. 28 is a graph showing results thereof. In FIG. 28, (●)(Δ)(□) represent results of calculations performed for the corresponding random structures in FIG. 27. Herein, the transparent substrate 14 had a refractive index of 1.51; the low-refractive index layer 15a had a refractive index of 1.45; and the high-refractive index layer 15b had a refractive index of 1.76.

In the (●) structure, rectangular solids with a structure size of 0.6 μm and a height of 0.2 to 0.8 μm are randomly arrayed. In the (Δ) structure, rectangular solids with a structure size of 1.2 μm and a height of 0.6 μm are randomly arrayed. However, their randomness is controlled so that no three or more blocks successively appear along the same direction. In the (□) structure, hexagonal columns with a structure size (diameter of a circle inscribed in a hexagon) 1.2 μm and a height of 0.6 to 1.2 μm are randomly arrayed. However, their randomness is controlled so that no four or more blocks successively appear along the same direction. First, as for height dependence, it can be seen that efficiency is hardly affected in any of these structures. Next, as for randomness of the structure, it is indicated that efficiency improves in the order from (●) to (Δ) to (□). A comparison between (●) and (Δ) indicates that it makes for an improved efficiency to control randomness so that successive arrangement of blocks is restricted. This is because, if blocks were side by side in succession, effectively a region of a large structure size would exist, such a region having a deteriorated extraction efficiency. In fact, the (●) random structure manifests places where six or more blocks are side by side in succession along the same direction. In other words, there are local structures that are sized 3.6 μm (=0.6 μm×6) or larger. With reference to the results of dependence of efficiency on the structure size w of the periodic structure shown in FIG. 26, it can be seen that not a very high extraction efficiency is obtained for a structure size of 3.6 µm. This would indicate that regions of such large size would lower the extraction efficiency.

Furthermore, the efficiency is more enhanced when hexagons are arrayed than when rectangles are arrayed. This is because the diagonal length of a square is √2 times its side length, whereas the diagonal length of a regular hexagon is √3/2 times its side length; thus, regular hexagons have less dependence on orientation. In other words, when squares are arrayed, the extraction efficiency will inevitably be lower along either the side directions or the diagonal directions; on the other hand, in the case of regular hexagons, a high extraction efficiency will be obtained regardless of orientation. Comparison of the experimental results of (Δ) and (□) shown in FIG. 28 also supports this.

Figure 29:
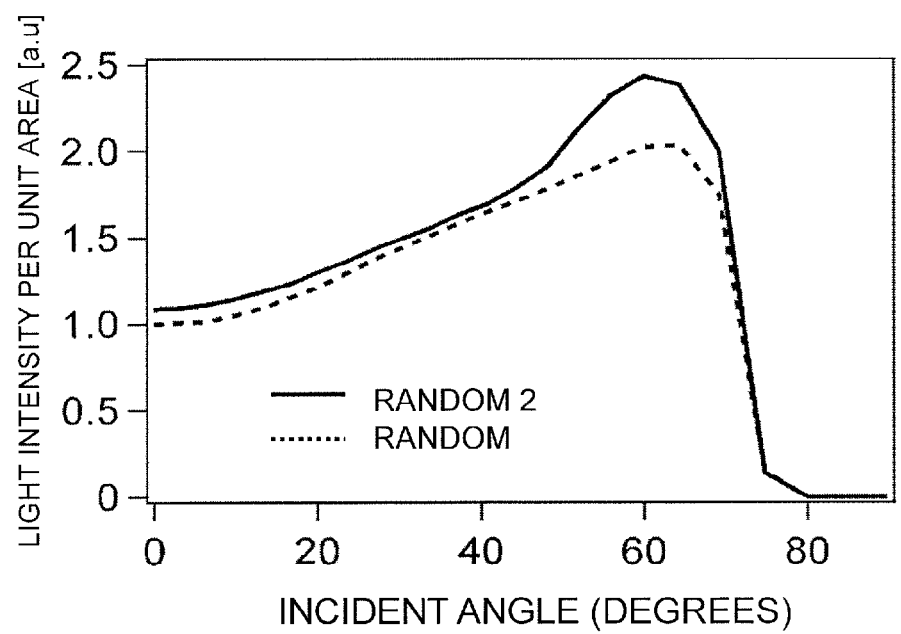
FIG. 29 A graph showing a difference between a completely random pattern and a random pattern with controlled randomness.

In order to examine the effects of patterns with controlled randomness, the distribution of light intensity within the transparent substrate 14 was measured for Random and Random 2 devices (height: 0.6 µm) shown in FIG. 27, with a similar construction to that of FIG. 7. The results are shown in FIG. 29. These results indicate that light on the higher angle side (near 50 to 70 degrees) is particularly increased in the structure with controlled randomness. Thus, a higher efficiency is obtained by combining the internal light-extraction layer 15 having a bump-dent structure of such controlled randomness with the external light-extraction layer 16 having a high transmittance at an incident angle of 40 degrees to 60 degrees.

Figure 30:
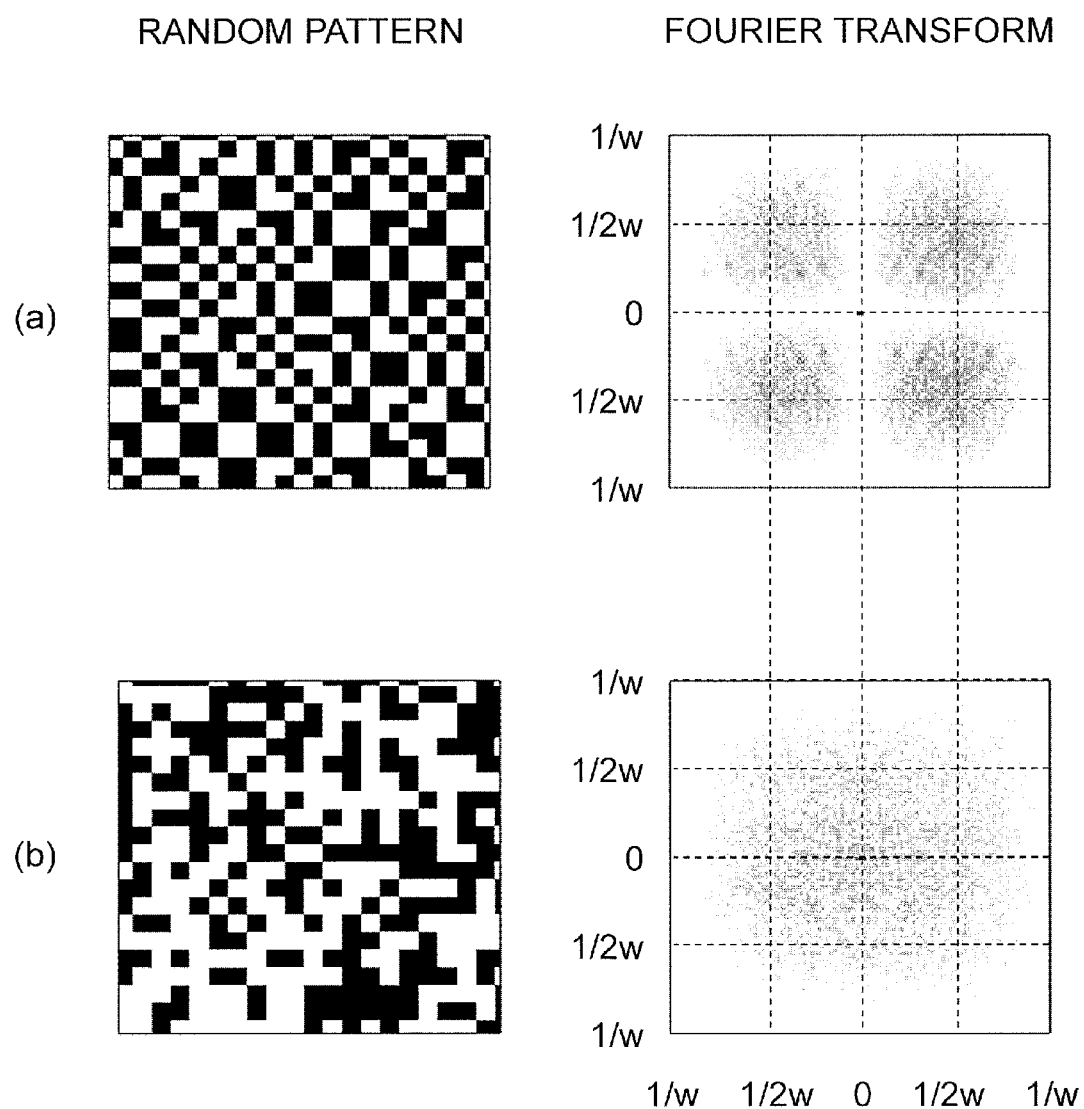
FIG. 30 (a) is a diagram showing Fourier components of a completely random pattern; (b) is a diagram showing Fourier components of a pattern with controlled randomness.

Thus, a method of randomness control based on reducing large blocks emerging from side-by-side successions, as well as effects thereof, was discussed. Reduction in such large blocks can also be checked by applying a Fourier transform to a random pattern. FIG. 30 is a diagram showing amplitude of spatial frequency components when applying a Fourier transform to a random pattern. The center of a distribution diagram on the right-hand side of FIG. 30 shows a component whose spatial frequency is zero (DC component). This diagram is illustrated so that spatial frequency increases from the center toward the outside. As will be understood from the figure, low-frequency components are suppressed in the spatial frequencies of the controlled random pattern shown in FIG. 30(a), as compared to the random pattern shown in FIG. 30(b). In particular, among the spatial frequency components, those components which are smaller than $1/(2w)$ are suppressed.

In the present embodiment, a bump-dent structure is created by arraying blocks of the same size; with a random array of these, the light extraction efficiency becomes high when w is set to a value in a range from 0.4 to 2 µm, as shown in FIG. 26. Based on this, it would also be applicable to randomly array a plurality of blocks whose size is appropriately altered within this range.

Figure 31:
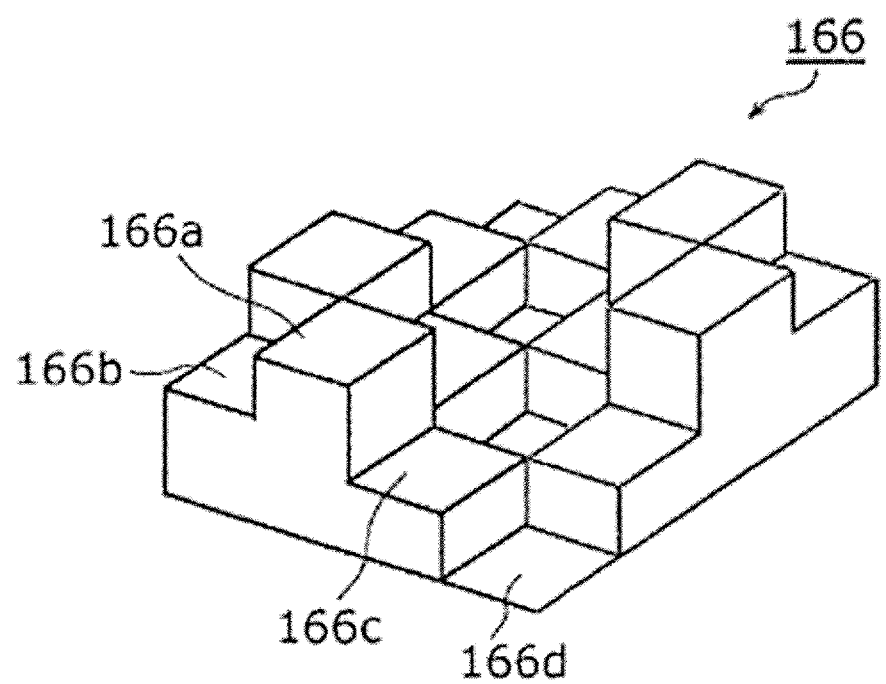
FIG. 31 A diagram showing a variant bump-dent structure.

Moreover, phase differences are imparted to light based on the height of each block, thus to diffract light for light extraction. Therefore, the height h of the blocks does not need to be constant. For example, a plurality of height levels may be introduced. Moreover, there may be random heights among blocks. FIG. 31 is a perspective view showing an exemplary construction in which random block heights are adopted. The bump-dent structure 166 shown in the figure includes a random two-dimensional array of first unit structures 166a of a first height, second unit structures 166b of a second height, third unit structures 166c of a third height, and fourth unit structures 166d of a fourth height. In the bump-dent structure 166, each block is filled with a high-refractive index material and a low-refractive index material, so that differences occur in the phase of light which travels through these portions. Therefore, even in the case of random heights, an average phase difference of transmitted light is to be determined by an average height of the plurality of unit structures, such that a sufficient average phase difference will be imparted to the transmitted light also in this case. Thus, random heights may be adopted.

The corner portion(s) of each cross-sectional shape may rounded. In fact, when structures on the micron order are processed through cutting, a semiconductor process, etc., there are cases where the corner portions are processed so as to be rounded, or stepped portions are processed into slopes. If these factors arise when processing the bump-dent structure of the internal light-extraction layer 15, any structure with corner portions being processed so as to be rounded is also encompassed within the present construction, so long as the aforementioned properties of a random pattern are not lost.

Even in the presence of noises such as small structures sized 0.73λ or less that may unintentionally occur during manufacture (originating from litter or the like) or large structures of 4 µm or more (scratches or the like), sufficient effects will still be obtained so long as they are on the order of 10% of the overall area. Therefore, even if such noises are intentionally introduced on the order of 10%, such will be encompassed by the present invention so long as the effects are obtained.

[2-3-5. Variant of Light-Emitting Element 110]

Figure 32:
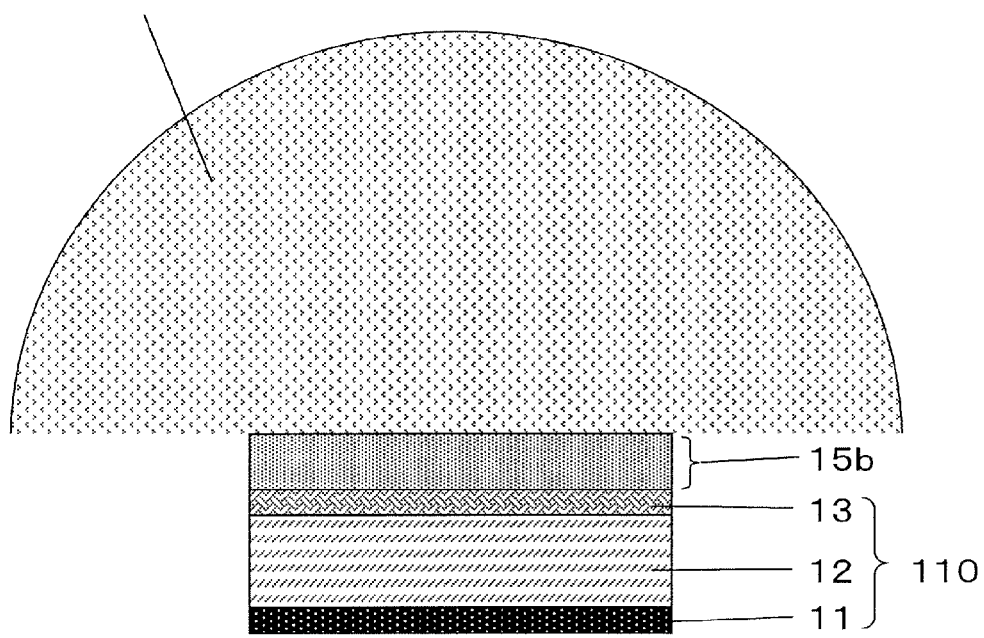
FIG. 32 A diagram showing a measurement method of an angular distribution of emission intensity.
Figure 33A:
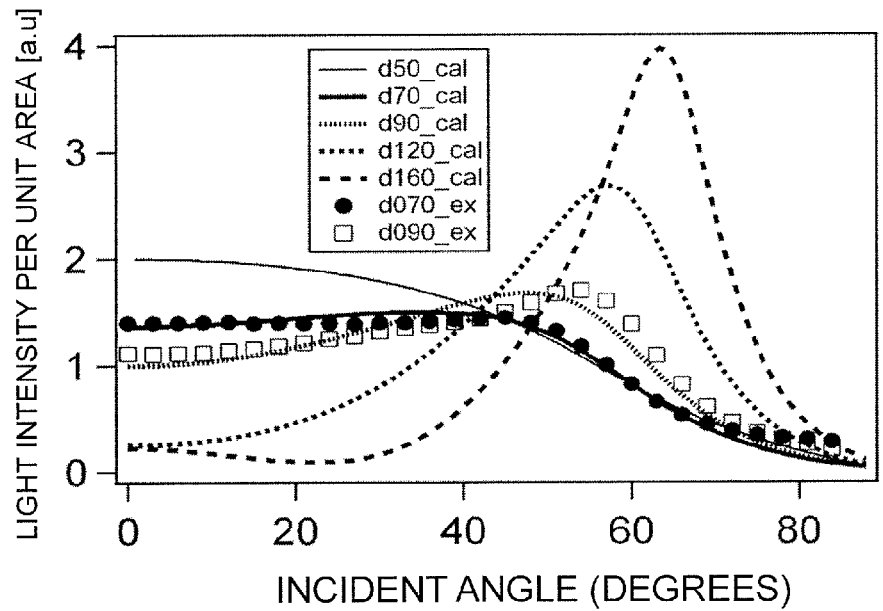
FIG. 33A A first graph illustrating how the incident angle dependence of light intensity may vary depending on the position of an emission point.
Figure 33B:
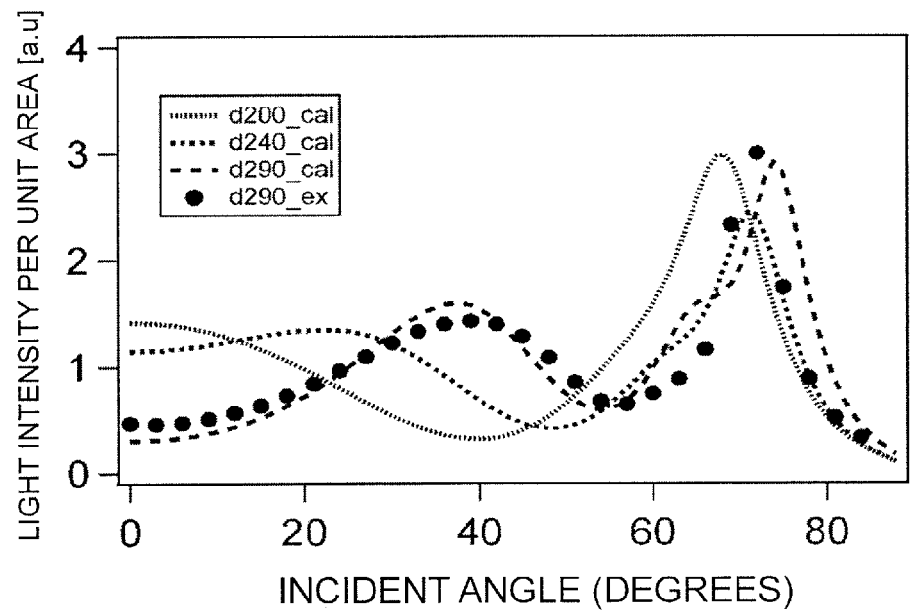
FIG. 33B A second graph illustrating how the incident angle dependence of light intensity may vary depending on the position of an emission point.

Next, a variant of the light-emitting element 110 will be described. As shown in FIG. 32, a high-refractive index hemispherical lens was placed on the high-refractive index layer 15b of the organic EL device 100 to measure an angular distribution of emission intensity of the emission layer 12. Three kinds of organic EL devices were prototyped in which an emission layer 12 with an emission wavelength of 580 nm was layered. The emission points of these elements were respectively set at positions of 70, 90 and 290 nm from the surface of the reflection electrode 11. The high-refractive index layer 15b and the high-refractive index hemispherical lens had a refractive index of 1.77. For comparison's sake, a simulation was also conducted. Calculation was performed for models having emission points with an emission wavelength of 580 nm at positions distanced 50, 70, 90, 120, 160, 200, 240 and 290 nm from the surface of the reflection electrode 11. The results of measurement and the results of calculation are shown in FIG. 33A and FIG. 33B. The results of the cases where the distance from the surface of the reflection electrode 11 was 160 nm or less are shown in FIG. 33A, while the results of the cases where this distance was 200 nm or more are shown in FIG. 33B. The experimental results and the measurement results match well.

When the position of the emission point is 90 nm or less, there is hardly any light of 60 degrees or more. This indicates that, when the distance between the transparent electrode 13 and the surface of the reflection electrode 11 is small, light on the higher angle side combines with a surface plasmon on the reflection electrode, thus becoming lost. Assuming that the emission layer 12 has a refractive index of 1.75 and the transparent substrate 14 has a refractive index of 1.5, the critical angle of the light propagating from the emission layer 12 to the transparent substrate 14 is approximately 60 degrees. Therefore, in the case where light of 60 degrees or more is absent, there is no need to internally provide a light extraction structure, to begin with.

Figure 34:
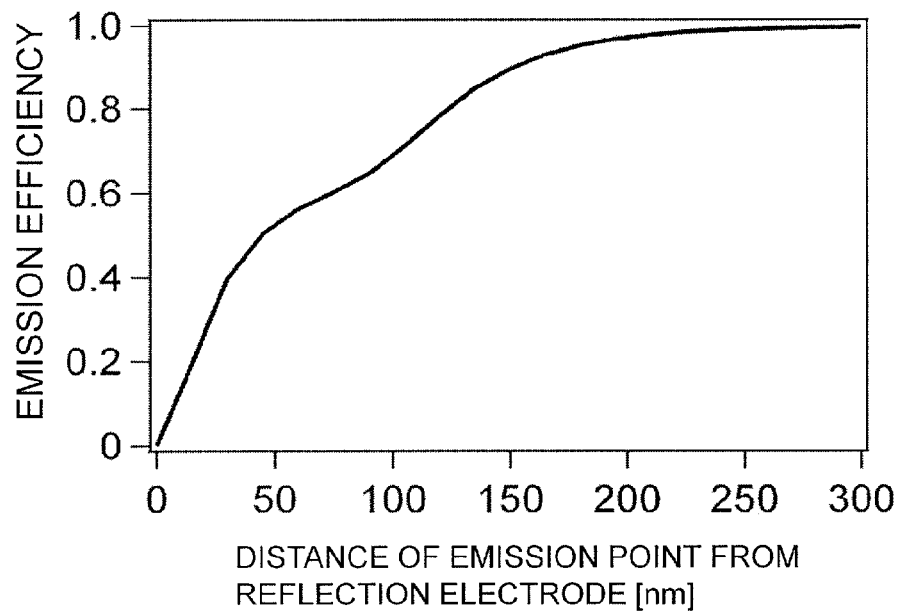
FIG. 34 A graph showing dependence of emission efficiency on the position of an emission point.

Furthermore, FIG. 34 shows results of calculating dependence of emission efficiency on the distance between the emission point and the reflection electrode 11. When the position of the emission point is 90 nm or less from the surface of the reflection electrode 11, the emission efficiency is 60% or less, indicating that 40% or more of the light has combined with a surface plasmon to become lost. In this situation, no matter how much the extraction efficiency may be enhanced, the propagating light to occur will only account for a small proportion to begin with, and thus efficiency enhancement has its limits.

Based on the above, it is necessary to make the distance between the emission point and the surface of the reflection electrode 11 longer than 90 nm in order to enhance the emission efficiency. However, doing so will result in a large amount of light of the critical angle (about 60 degrees) or above, which makes the internal light-extraction layer 15 necessary.

Figure 35:
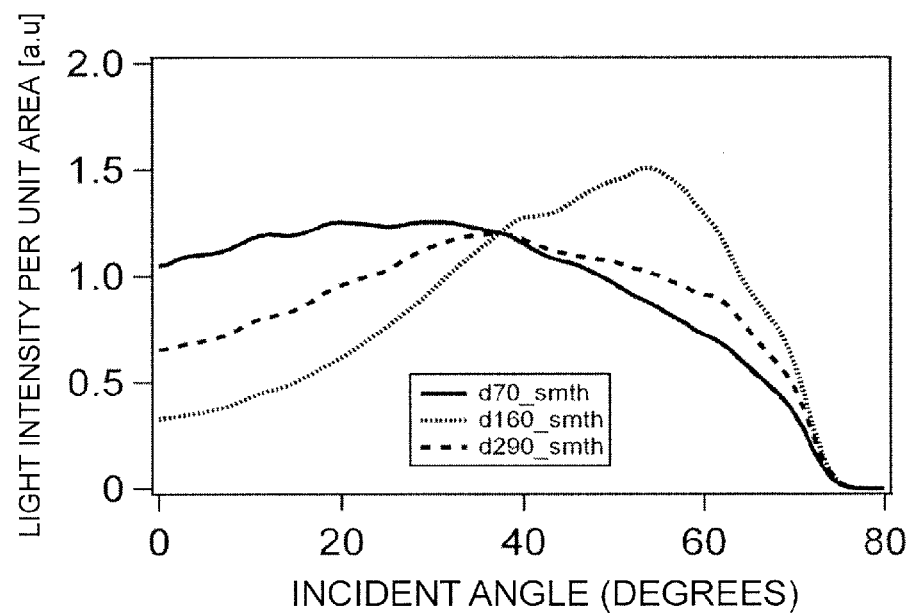
FIG. 35 A graph showing incident angle dependence of the intensity of light passing through the internal light-extraction layer where the position of the emission point is varied.

In three models in which an emission point of the emission wavelength 580 nm was set at positions of 70, 160 and 290 nm from the surface of the reflection electrode 11, the internal light-extraction layer 15 was introduced. An angular distribution of light intensity within the transparent substrate 14 after passage through the internal light-extraction layer 15 was calculated. The results of calculation are shown in FIG. 35. Herein, the transparent substrate 14 had a refractive index of 1.51, the low-refractive index layer 15a had a refractive index of 1.45; the high-refractive index layer 15b had a refractive index of 1.76; and the bump-dent structure was a random structure.

In the element whose emission layer 12 has an emission point at the position of 70 nm, at which not much light of the critical angle or above exists to begin with (see FIG. 33A), light abounds on the lower angle side even in the transparent substrate 14 after passage through the internal light-extraction layer 15. On the other hand, in the elements whose emission layer 12 has an emission point at the positions of 160 and 290 nm, at which there is profuse light of the critical angle or above (see FIG. 33A and FIG. 33B), light abounds on the higher angle side even in the transparent substrate 14 after passage through the internal light-extraction layer 15.

Figure 36:
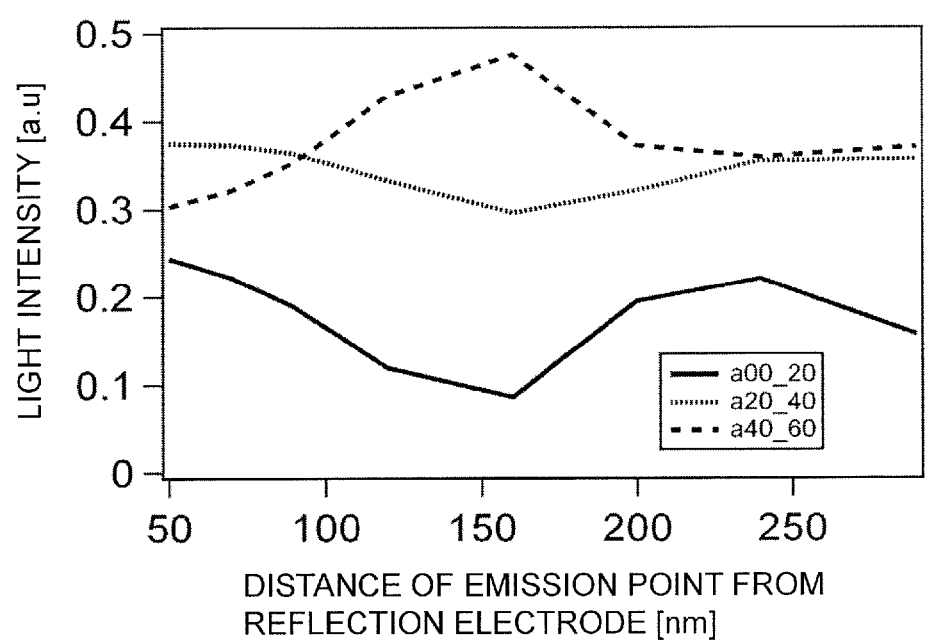
FIG. 36 A graph showing changes in the total amount of light contained in the respective incident angle ranges of 0° to 20°, 20° to 40°, and 40° to 60° where the position of the emission point is varied.

For a more detailed analysis, an intensity distribution of light in the transparent substrate 14 was calculated relative to the incident angle, where the distance from the emission layer 12 to the surface of the reflection electrode 11 was ranged from 50 to 290 nm. FIG. 36 shows, among the calculation results, results of plotting the total amount of light with incident angles falling within the respective ranges of 0° to 20°, 20° to 40°, and 40° to 60°, against the distance between the emission point and the surface of the reflection electrode 11. These results indicate that the total amount of light in the angle range of 40° to 60° is largest in elements whose distance from the surface of the reflection electrode 11 to the emission point is 100 nm or greater. Therefore, a high efficiency is obtained by combining such an light-emitting element 110 with an external light-extraction layer 16 having a high transmittance for light arriving at an incident angle of 40 degrees to 60 degrees.

Thus, it has been found that, given an emission wavelength of 580 nm, a high light extraction efficiency is expected if the distance from the surface of the reflection electrode 11 to the emission point in the emission layer 12 is 100 nm or more. Since the angular distribution of light is governed by interference effects, given an emission wavelength $\lambda$, a high light extraction efficiency is expected if the distance from the surface of the reflection electrode 11 to the emission point in the emission layer 12 is $0.17\lambda (=100/580 \times \lambda)$ or more.

Although the light-emitting element 110 in the above embodiment emits light through organic EL, it is also possible to use other light-emitting elements, e.g., inorganic EL. In other words, the light-emitting element 110 may have any arbitrary construction so long as a light extraction sheet 120 including the internal light-extraction layer 15, the transparent substrate 14, and the external light-extraction layer 16 is provided. Instead of the reflection electrode 11 in the above description, an electrode which lacks a light-reflecting property may be used.

INDUSTRIAL APPLICABILITY

An illuminator according to the present disclosure is applicable to flat panel displays, backlights for liquid crystal display devices, light sources for illumination, etc., for example. A light extraction sheet according to the present disclosure is applicable to the aforementioned illuminator.

REFERENCE SIGNS LIST 11 reflection electrode
12 emission layer
13 transparent electrode
14 transparent substrate
15 internal light-extraction layer
15a low-refractive index layer
15b high-refractive index layer
16 external light-extraction layer
100 organic EL device
110 light-emitting element
120 light extraction sheet

The invention claimed is:
1. An illuminator comprising:
a light-emitting element for emitting light of an average wavelength $\lambda$; and
a light extraction sheet which transmits light emitted from the light-emitting element,
the light-emitting element including
  a first electrode having a light transmitting property,
  a second electrode, and
  an emission layer between the first and second electrodes,
the light extraction sheet including:
  a light-transmitting substrate having a first face and a second face that is opposite to the first face;
  a first light extraction structure that is on the first face of the light-transmitting substrate and that is between the light transmitting substrate and the light emitting element, the first light extraction structure including a low-refractive index layer having a lower refractive index than the refractive index of the light-transmitting substrate and a high-refractive index layer having a higher refractive index than the refractive index of the low-refractive index layer, the low-refractive index layer being between the light-transmitting substrate and the high-refractive index layer, and an interface between the high-refractive index layer and the low-refractive index layer having bump-dent features; and
  a second light extraction structure on the second face of the light-transmitting substrate, the second light extraction structure being configured such that light which is transmitted through the light-transmitting substrate and arrives at an incident angle of 40 degrees to 60 degrees has an average transmittance of 42% or more.

2. The illuminator of claim 1, wherein the bump-dent features comprise a random two-dimensional array of a plurality of dents and a plurality of bumps.

3. The illuminator of claim 1, wherein the bump-dent features comprises a periodic two-dimensional array of a plurality of dents and a plurality of bumps.

4. The illuminator of claim 1, wherein the bump-dent features comprise a two-dimensional array of a plurality of dents and a plurality of bumps, and among spatial frequency components of a pattern of the bump-dent features, those components which are smaller than 1/(2w) are suppressed as compared to when the plurality of dents and the plurality of bumps are randomly arrayed, where w is a minimum value of lengths of shorter sides of ellipses which are inscribed in the plurality of dents and the plurality of bumps.

5. The illuminator of claim 4, wherein the bump-dent features are arranged so that no predetermined number or more of dents or bumps are successively located along one direction.

6. The illuminator of claim 5, wherein the plurality of dents and the plurality of bumps each have a rectangular cross section, and the bump-dent features are arranged so that no three or more dents or bumps are successively located along one direction.

7. The illuminator of claim 5, wherein the plurality of dents and the plurality of bumps each have a hexagonal cross section, and the bump-dent features are arranged so that no four or more dents or bumps are successively located along one direction.

8. The illuminator of claim 2, wherein a minimum value of lengths of shorter sides of ellipses which are inscribed in the plurality of dents and the plurality of bumps is $0.73\lambda$ or more.

9. The illuminator of claim 2, wherein the plurality of dents and the plurality of bumps have a same cross-sectional shape and a same size.

10. The illuminator of claim 9, wherein the plurality of dents and the plurality of bumps each have an average period of $14.5\lambda$ or less.

11. The illuminator of claim 1, wherein the low-refractive index layer has a refractive index which is 0.98 times or less of a refractive index of the light-transmitting substrate.

12. The illuminator of claim 1, wherein a distance between an emission point in the emission layer and the surface of the second electrode is $0.17\lambda$ or more.

13. The illuminator of claim 1, wherein the low-refractive index layer has a refractive index of 1.47 or less.

14. The illuminator of claim 1, wherein the low-refractive index layer has a thickness of $(½)\lambda$ or more.

15. The illuminator of claim 1, wherein the light-transmitting substrate has a refractive index of 1.5 or more.

16. The illuminator of claim 1, wherein the high-refractive index layer has a refractive index of 1.73 or more.

17. The illuminator of claim 1, wherein the second light extraction structure comprises a microlens array.

18. The illuminator of claim 17, wherein the microlens array has an aspect ratio of 0.5 or more.

19. The illuminator of claim 1, wherein the second light extraction structure comprises pyramidal structures, vertex angles of the pyramidal structures being in a range from 30 degrees to 120 degrees.

20. A light extraction sheet comprising:
a light-transmitting substrate having a first face and a second face that is opposite the first face;
a first light extraction structure on the first face of the light-transmitting substrate, the first light extraction structure including a low-refractive index layer having a lower refractive index than the refractive index of the light-transmitting substrate and a high-refractive index layer having a higher refractive index than the refractive index of the low-refractive index layer, the low-refractive index layer being between the light-transmitting substrate and the high-refractive index layer, and an interface between the high-refractive index layer and the low-refractive index layer having bump-dent features; and
a second light extraction structure on the second face of the light-transmitting substrate, the second light extraction structure being configured such that light which is transmitted through the light-transmitting substrate and arrives at an incident angle of 40 degrees to 60 degrees has an average transmittance of 42% or more.

* * * * *